US011158593B2

(12) United States Patent
Chen et al.

(10) Patent No.: US 11,158,593 B2
(45) Date of Patent: Oct. 26, 2021

(54) STRUCTURES FOR BONDING A GROUP III-V DEVICE TO A SUBSTRATE BY STACKED CONDUCTIVE BUMPS

(71) Applicant: Taiwan Semiconductor Manufacturing Co., Ltd., Hsin-Chu (TW)

(72) Inventors: Jhih-Bin Chen, Hsinchu (TW); Chia-Shiung Tsai, Hsin-Chu (TW); Ming Chyi Liu, Hsinchu (TW); Eugene Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/829,267

(22) Filed: Mar. 25, 2020

(65) Prior Publication Data
US 2020/0227369 A1    Jul. 16, 2020

Related U.S. Application Data

(63) Continuation of application No. 16/025,046, filed on Jul. 2, 2018, now Pat. No. 10,643,964.

(51) Int. Cl.
*H01L 23/12* (2006.01)
*H01L 23/48* (2006.01)
(Continued)

(52) U.S. Cl.
CPC .............. *H01L 24/13* (2013.01); *H01L 24/11* (2013.01); *H01L 24/14* (2013.01); *H01L 24/16* (2013.01);
(Continued)

(58) Field of Classification Search
CPC ..... H01L 33/0075; H01L 24/13; H01L 24/11; H01L 24/16; H01L 24/76; H01L 24/17;
(Continued)

(56) References Cited

U.S. PATENT DOCUMENTS 8,592,232 B2   11/2013  Suh et al.
8,637,888 B2    1/2014  Hodota et al.
(Continued)

OTHER PUBLICATIONS

Non-Final Office Action dated Aug. 29, 2019 for U.S. Appl. No. 16/025,046.
(Continued)

*Primary Examiner* — Alonzo Chambliss
(74) *Attorney, Agent, or Firm* — Eschweiler & Potaschnik, LLC

(57) ABSTRACT

Various embodiments of the present application are directed towards a method for forming an integrated chip in which a group III-V device is bonded to a substrate, as well as the resulting integrated chip. In some embodiments, the method includes: forming a chip including an epitaxial stack, a metal structure on the epitaxial stack, and a diffusion layer between the metal structure and the epitaxial stack; bonding the chip to a substrate so the metal structure is between the substrate and the epitaxial stack; and performing an etch into the epitaxial stack to form a mesa structure with sidewalls spaced from sidewalls of the diffusion layer. The metal structure may, for example, be a metal bump patterned before the bonding or may, for example, be a metal layer that is on an etch stop layer and that protrudes through the etch stop layer to the diffusion layer.

20 Claims, 26 Drawing Sheets

(51) Int. Cl.
*H01L 21/00* (2006.01)
*H01L 21/28* (2006.01)
*H01L 23/00* (2006.01)
*H01S 5/183* (2006.01)
*H01S 5/343* (2006.01)
*H01S 5/0234* (2021.01)
*H01S 5/02355* (2021.01)
*H01L 25/075* (2006.01)
*H01L 33/46* (2010.01)
*H01L 25/065* (2006.01)

(52) U.S. Cl.
CPC .............. *H01L 24/17* (2013.01); *H01L 24/73* (2013.01); *H01L 24/81* (2013.01); *H01L 25/0657* (2013.01); *H01L 25/0753* (2013.01); *H01L 33/46* (2013.01); *H01S 5/0234* (2021.01); *H01S 5/02355* (2021.01); *H01S 5/18361* (2013.01); *H01S 5/34313* (2013.01); *H01L 2224/1146* (2013.01); *H01L 2224/11614* (2013.01); *H01L 2224/13021* (2013.01); *H01L 2224/13084* (2013.01); *H01L 2224/13105* (2013.01); *H01L 2224/13144* (2013.01); *H01L 2224/13155* (2013.01); *H01L 2224/13166* (2013.01); *H01L 2224/16145* (2013.01); *H01L 2224/73257* (2013.01); *H01L 2924/01032* (2013.01); *H01L 2924/01033* (2013.01); *H01L 2924/10337* (2013.01); *H01L 2924/12042* (2013.01)

(58) Field of Classification Search
CPC . H01L 25/0753; H01L 25/0657; H01L 33/46; H01L 24/81; H01L 24/14; H01L 24/73; H01S 5/0224; H01S 5/02256; H01S 5/518361; H01S 5/34313
See application file for complete search history.

(56) References Cited

U.S. PATENT DOCUMENTS

| | | | |
|---|---|---|---|
| 10,516,081 B1* | 12/2019 | Xin | H01L 33/24 |
| 10,643,964 B2* | 5/2020 | Chen | H01L 24/24 |
| 2003/0015721 A1 | 1/2003 | Slater, Jr. et al. | |
| 2009/0289273 A1 | 11/2009 | Tsai et al. | |
| 2011/0143466 A1 | 6/2011 | Chen et al. | |
| 2011/0220934 A1* | 9/2011 | Gotoda | H01L 33/44 |
| | | | 257/98 |
| 2011/0297914 A1 | 12/2011 | Zheng et al. | |
| 2013/0032845 A1 | 2/2013 | Chuang et al. | |
| 2014/0061709 A1 | 3/2014 | Suh et al. | |
| 2015/0008540 A1 | 1/2015 | Chu et al. | |
| 2015/0214448 A1 | 7/2015 | Lee et al. | |
| 2017/0062686 A1* | 3/2017 | Yoneda | H01L 24/11 |
| 2017/0170365 A1 | 6/2017 | Lim et al. | |
| 2019/0312644 A1* | 10/2019 | Hu | H04B 10/40 |

OTHER PUBLICATIONS

Notice of Allowance dated Dec. 30, 2019 for U.S. Appl. No. 16/025,046.

* cited by examiner

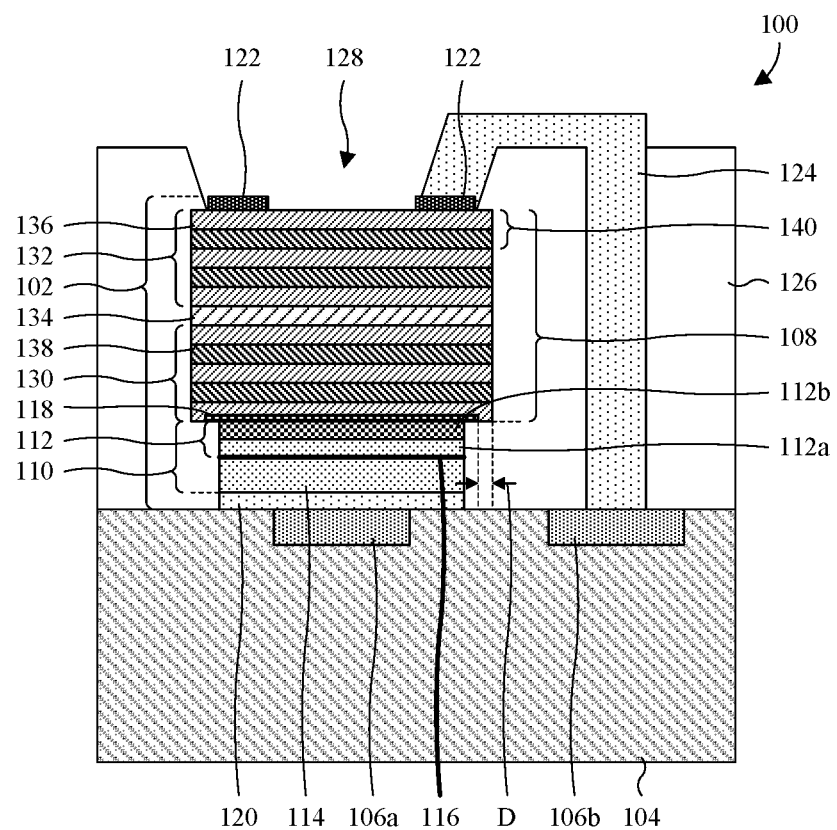
Fig. 1
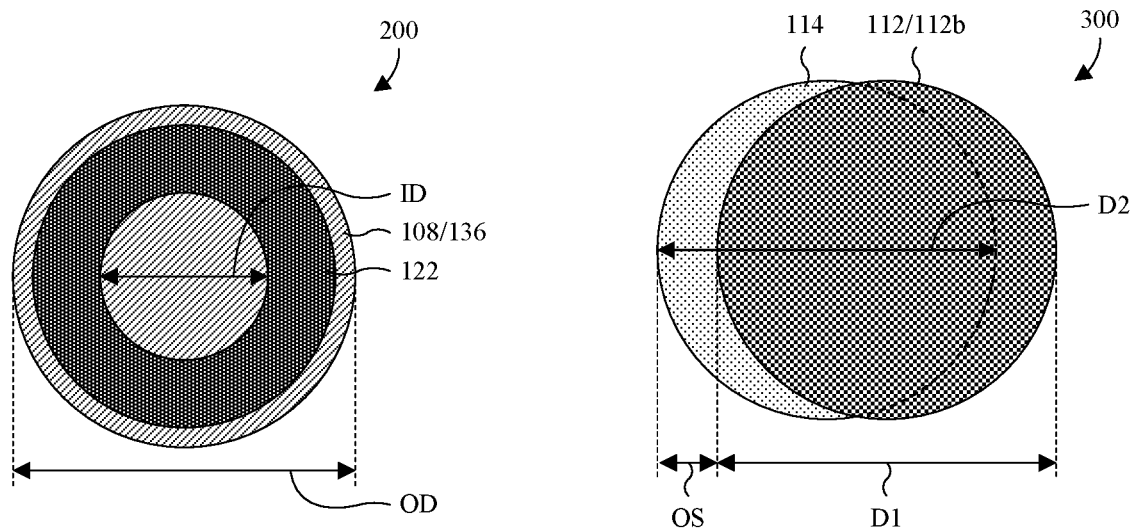
Fig. 2
Fig. 3

US 11,158,593 B2

STRUCTURES FOR BONDING A GROUP III-V DEVICE TO A SUBSTRATE BY STACKED CONDUCTIVE BUMPS

REFERENCE TO RELATED APPLICATION

This application is a Continuation of U.S. application Ser. No. 16/025,046, filed on Jul. 2, 2018, the contents of which are hereby incorporated by reference in their entirety.

BACKGROUND

Semiconductor devices based on silicon have been the standard for the past few decades. However, semiconductor devices based on alternative materials are receiving increasing attention for advantages over semiconductor devices based on silicon. For example, semiconductor devices based on group III-V semiconductor materials have been receiving increasing attention due to high electron mobility and direct bandgaps compared to semiconductor devices based on silicon.

While semiconductor devices based on alternative materials are receiving increasing attention, the technology is not as mature as that for semiconductor devices based on silicon. As such, applications of semiconductor devices based on alternative materials are more limited and costs are higher. Integrated chips comprising semiconductor devices based on both silicon and alternative materials may therefore be employed to ameliorate the above concerns.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a cross-sectional view of some embodiments of an integrated chip in which a group III-V device is bonded to a substrate with a pre-patterned mesa-side bump.

FIG. 2 illustrates a top view of some embodiments of a frontside contact of the group III-V device of FIG. 1.

FIG. 3 illustrates a top view of some embodiments of mesa-side and substrate-side bumps of the group III-V device of FIG. 1.

DETAILED DESCRIPTION

Figure 4A:
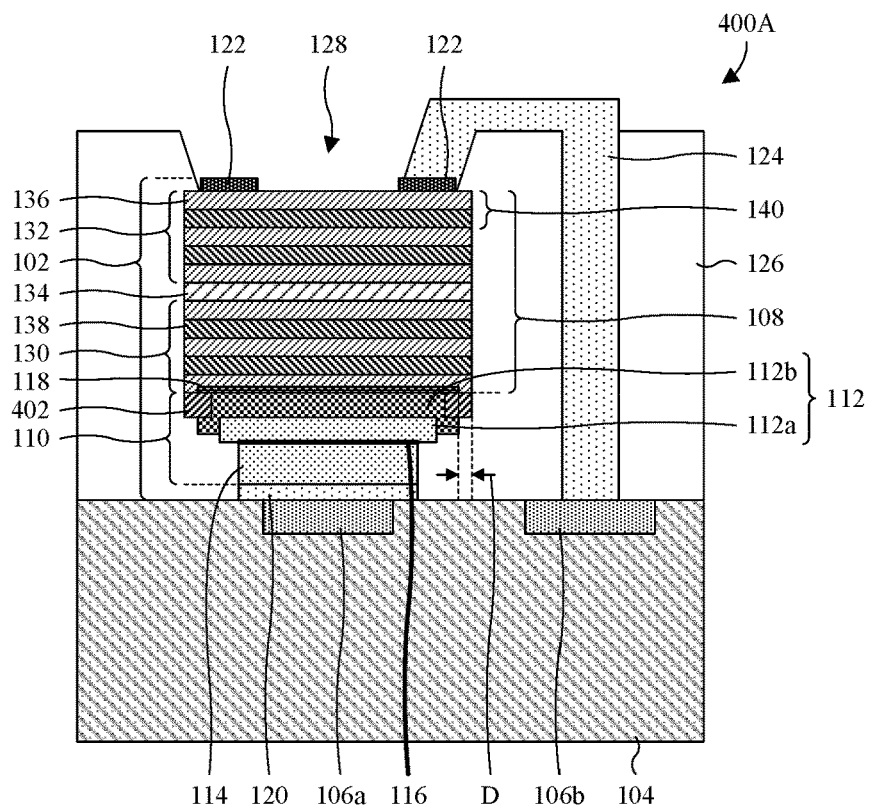
FIGS. 4A and 4B illustrate cross-sectional views of various alternative embodiments of the integrated chip of FIG. 1 in which the group III-V device has an etch stop layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to a method for forming an integrated circuit (IC) chip with both silicon and group III-V semiconductor devices, a chip comprising a group III-V epitaxial stack and a metal layer is formed. Silicon-based complementary metal-oxide-semiconductor (CMOS) devices are formed on a wafer, an interconnect structure is formed covering the silicon-based CMOS devices and the wafer, and wafer metal bumps are formed on the interconnect structure. The chip is positioned so the metal layer is between the wafer metal bumps and the group III-V epitaxial stack and is subsequently bonded to a die region of the wafer via the wafer metal bumps. A dry etch is performed into the chip to define mesa structures, and to further define chip metal bumps. The mesa structures at least partially define individual group III-V semiconductor devices, which may, for example, be vertical-cavity surface-emitting lasers (VCSELs) or some other suitable devices. The chip metal bumps are individual to the group III-V semiconductor devices and electrically couple the group III-V semiconductor devices respectively to adjoining wafer metal bumps. A wet etch is performed to shrink the chip metal bumps, and the wafer is subsequently separated into individual IC chips.

A challenge with the method is that metal from the metal layer diffuses into the epitaxial stack and forms a diffusion layer that is difficult to chemically etch. For example, the diffusion layer may comprise a combination of nickel, germanium, gold, gallium, and arsenic. Accordingly, the dry etch is performed using ion bombardment. However, ion bombardment is messy and leads to the redeposition of etched material on sidewalls of the etch process chamber and sidewalls of the wafer bumps. The redeposition may lead to electrical shorting of the wafer bumps, which may lead to low manufacturing yields. Further, the redeposition may reduce etch rates and/or may lead to contamination of other wafers used in the etch process chamber. Another challenge is the wet etch may significantly shrink the chip bumps. Typically, the chip bumps comprise individual nickel/gold segments and individual gold segments adjoining the nickel/gold segments. The etchant used for the wet etch may have a high etch rate for the gold segments relative to the nickel/gold segments, whereby the gold segments may be significantly reduced in size. This, in turn, leads to high electrical resistance and negatively impacts the performance and power efficiency of the group III-V semiconductor devices.

Various embodiments of the present application are directed towards a method for forming an integrated chip in which a group III-V device is bonded to a substrate, as well as the integrated chip resulting from the method. In some embodiments, the method includes: forming a chip including an epitaxial stack, a metal structure on the epitaxial stack, and a diffusion layer between the metal structure and the epitaxial stack; bonding the chip to a substrate so the metal structure is between the substrate and the epitaxial stack during the bonding; and performing an etch into a mesa area of the epitaxial stack to form a mesa structure with sidewalls spaced from the diffusion layer. The diffusion layer comprises metal from the metal structure, and further comprises semiconductor material from the epitaxial stack.

In some embodiments, the metal structure is a metal bump and the forming of the chip comprises forming the metal structure by a metal liftoff process before the bonding. In some embodiments, the forming of the chip comprises depositing an etch stop layer on the epitaxial stack and patterning the etch stop layer to form an opening localized to, and spaced from side boundaries of, the mesa area. The etch stop layer may, for example, be employed as an etch stop for the etch. In other embodiments, the etch stop layer is not formed. In some embodiments in which the metal structure is a metal bump, the metal structure is formed by the metal liftoff process in the opening before the bonding. In some embodiments, the metal structure is a metal layer and the forming of the chip comprises forming the metal structure covering the etch stop layer and filling the opening before the bonding. In such embodiments, the metal structure is patterned into a metal bump after the etch.

The diffusion layer forms by diffusion of metal from the metal structure into the epitaxial stack. By forming the metal structure as a metal bump using a metal liftoff process, the metal structure may be limited to contact with the epitaxial stack at a contact interface localized to the mesa area and spaced from side boundaries of the mesa area. Therefore, diffusion of metal into the epitaxial stack may be limited to the contact interface. Further, the diffusion layer may form localized to the contact interface and hence spaced from the side boundaries of the mesa area. By forming the metal structure as a metal layer on the etch stop layer, the etch stop layer may partially space the metal structure from the epitaxial stack so the metal structure is limited to contact with the epitaxial stack at a contact interface in the opening of the etch stop layer. Since the opening of the etch stop layer is localized to the mesa area and spaced from the side boundaries of the mesa area, the contact interface is also localized to the mesa area and spaced from the side boundaries of the mesa area. Therefore, as above, diffusion of metal into the epitaxial stack may be limited to the contact interface. Further, the diffusion layer may form localized to the contact interface and hence spaced from the side boundaries of the mesa area.

By forming the diffusion layer spaced from side boundaries of the mesa area, the etch may be performed without etching through the diffusion layer. As such, sidewalls of the mesa structure may be formed spaced from the diffusion layer. In some embodiments, semiconductor material from the epitaxial stack and metal from the metal structure combines in such a way that the diffusion layer is difficult to etch and/or remove by a wet and/or chemical etchant. By forming the diffusion layer spaced from side boundaries of the mesa area, the etch may be performed by a wet and/or chemical etchant. Otherwise, the etch may be performed by ion bombardment. However, ion bombardment is messy compared to wet and/or chemical etching due to the transfer of kinetic energy from ions to material being etched. For example, etched material may redeposit and cause electrical shorting between pads and/or contacts. As another example, etched material may redeposit on sidewalls of an etch process chamber, where it may reduce etch rates and/or may lead to contamination of other structures processed in the etch process chamber. Therefore, performing the etch by wet and/or chemical etching avoids the challenges associated with ion bombardment.

As describe above, the metal structure is a metal bump formed before the bonding in some embodiments. By forming the metal structure as such, other bumps and/or structures on the substrate are not subject to damage and/or shrinkage from an etching process performed to pattern the metal structure into a metal bump after the etch.

With reference to FIG. 1, a cross-sectional view 100 of some embodiments of an integrated chip is provided in which a group III-V device 102 is bonded to a substrate 104. The substrate 104 comprises a first pad 106a and a second pad 106b along a top surface of the substrate 104. In some embodiments, the substrate 104 comprises a semiconductor substrate (not shown), semiconductor devices on the semiconductor substrate (not shown), and an interconnect structure covering the semiconductor substrate and the semiconductor devices. The interconnect structure may, for example, electrically couple the first and second pads 106a, 106b to the semiconductor devices.

The group III-V device 102 overlies the first pad 106a and comprises a mesa structure 108 and a bump structure 110. The mesa structure 108 overlies the bump structure 110 and may be or comprise, for example, indium gallium arsenide, aluminum gallium arsenide, some other group III-V material(s), or any combination of the foregoing. The bump structure 110 comprises a mesa-side bump 112 and a substrate-side bump 114 that are bonded together at a bond interface 116. The mesa-side and substrate-side bumps 112, 114 are conductive and may be or comprise, for example, gold, nickel, titanium, some other suitable metal(s), some other suitable conductive material(s), or any combination of the foregoing.

In some embodiments, the mesa-side bump 112 comprises a first bump segment 112a, and further comprises a second bump segment 112b overlying the first bump segment 112a. The first bump segment 112a may be or comprise, for example, gold, titanium, some other suitable metal(s), or any combination of the foregoing, and/or may, for example, comprise a gold layer and a titanium layer overlying the gold layer. In some embodiments, the substrate-side bump 114 and the first bump segment 112a are or comprise the same material(s). Further, the first bump segment 112a may, for example, have a thickness of about 50-800 nanometers or some other suitable thickness(es). The second bump segment 112b may be or comprise, for example, nickel, gold, some other suitable metal(s), or any combination of the foregoing, and/or may, for example, comprise a gold layer, a first nickel layer overlying the gold layer, a germanium gold layer overlying the first nickel layer, and a second nickel layer overlying the germanium gold layer. Further, the second bump segment 112b may, for example, have a thickness of about 50-500 nanometers or some other suitable thickness(es). In some embodiments, the substrate-side bump 114 is or comprises gold and/or some other suitable metal(s), and/or has a thickness between about 0.5-5.0 micrometers or some other suitable thickness(es).

As seen hereafter, the mesa-side bump 112 may, for example, be formed before forming the mesa structure 108 by a metal liftoff process. By forming the mesa-side bump 112 as such, the mesa-side bump 112 and the substrate-side bump 114 may not be subject to etching damage. For example, if the mesa-side bump 112 was not formed by the metal liftoff process before forming the mesa structure 108, a wet etching process may be performed after forming the mesa structure 108 to form the mesa-side bump from a metal layer. However, the wet etchant may have a higher selectivity for the substrate-side bump 114 and the first bump segment 112a, relative to the second bump segment 112b, whereby the wet etchant may shrink the substrate-side bump 114 and/or form the first bump segment 112a substantially smaller than the second bump segment 112b. This, in turn, may lead to a small contact area at the bond interface 116. Further, resistance between the mesa-side and substrate-side bumps 112, 114 may be high and power efficiency may be low. Therefore, forming the mesa-side bump 112 by the metal liftoff process before forming the mesa structure 108 may lead to low resistance between the mesa-side and substrate-side bumps 112, 114 and may lead to power efficiency that is high.

A diffusion layer 118 is sunken into the underside of the mesa structure 108, between the mesa structure 108 and the bump structure 110. Further, the diffusion layer 118 is laterally spaced from outer sidewalls of the mesa structure 108 by a distance D. As seen hereafter, the diffusion layer 118 is formed by the diffusion of metal from the mesa-side bump 112 to an adjoining portion of the mesa structure 108. Therefore, the diffusion layer 118 comprises group III-V material from the mesa structure 108, and further comprises metal from the mesa-side bump 112. For example, the diffusion layer 118 may comprise germanium, gallium, arsenide, or any combination of the foregoing from the mesa structure 108, and may further comprise nickel, gold, or any combination of the foregoing from the mesa-side bump 112.

As seen hereafter, an etching process may be performed into a stack of one or more group III-V layers to form the mesa structure 108 from a mesa area of the group III-V stack. Further, as seen hereafter, the mesa-side bump 112 may be formed on the group III-V stack by a metal liftoff process before the etching process. By forming the mesa-side bump 112 by the metal liftoff process before the etching process, the diffusion layer 118 may form localized to the mesa-side bump 112 and spaced from a side boundary of the mesa area. This, in turn, allows the etching process to be performed without etching through the diffusion layer 118.

In some embodiments, the group III-V material from the mesa structure 108 and the metal from the mesa-side bump 112 combine in such a way that the diffusion layer 118 is difficult to etch and/or remove by a wet etchant. Therefore, where the etching process may be performed without etching through the diffusion layer 118, the etching process may be performed by wet etchant. Otherwise, the etching process may be performed using ion bombardment. However, ion bombardment is messy compared to wet etching due to the transfer of kinetic energy from ions to the etched material. For example, etched material may redeposit and electrically short the first and second pads 106a, 106b. As another example, the etched material may redeposit on sidewalls of an etch process chamber, where it may reduce etch rates and/or may lead to contamination of other structures processed in the etch process chamber. Therefore, by forming the mesa-side bump 112 by the metal liftoff process before the etching process, the challenges associated with ion bombardment may be avoided.

A backside contact 120 is on a backside of the group III-V device 102, between the first pad 106a and the bump structure 110, and is electrically coupled to the first pad 106a. A frontside contact 122 is on a frontside of the group III-V device 102, opposite the backside of the group III-V device 102, and is electrically coupled to the second pad 106b. For example, the frontside contact 122 may be electrically coupled to the second pad 106b by a conductive structure 124 extending from the second pad 106b to the frontside contact 122. In some embodiments, a top layout of the frontside contact 122 is square-ring shaped, circular-ring shaped, or some other suitable shape. The frontside and backside contacts 120, 122 may be or comprise, for example, titanium, tungsten, copper, some other suitable conductive material(s), or any combination of the foregoing. In some embodiments, the backside contact 120 comprises a titanium layer, a copper layer overlying the titanium layer, and a titanium tungsten layer overlying the copper layer. In some embodiments, the backside contact 120 has a thickness of about 2000-5000 angstroms, about 3200 angstroms, or some other suitable thickness(es).

A dielectric structure 126 surrounds the group III-V device 102 and, in some embodiments, defines a contact opening 128 on the frontside of the group III-V device 102. As seen hereafter, the group III-V device 102 may, for example, emit radiation (e.g., visible light or some other suitable radiation) from the frontside of the group III-V device 102, such that the contact opening 128 allows the radiation to pass through the dielectric structure 126 unimpeded. The dielectric structure 126 may be or comprise, for example, a molding compound, some other suitable dielectric material(s), or any combination of the foregoing.

In some embodiments, the group III-V device 102 is a vertical-cavity surface-emitting laser (VCSEL) and comprises a first Bragg reflector 130, a second Bragg reflector 132, and an active layer 134. The active layer 134 is between the first and second Bragg reflectors 130, 132 and may, for example, comprises one or more quantum wells. The active layer 134 may, for example, have a thickness of about 1-20 nanometers or some other suitable thickness(es). The active layer 134 may be or comprise, for example, indium gallium arsenide and/or some other suitable group III-V material(s). In some embodiments, the active layer 134 is or comprises $[In_xGaAs]_y$, where x is about 0.1-0.9 and y is about 1-5.

The first Bragg reflector 130 and the second Bragg reflector 132 are respectively on a backside of the group III-V device 102 and a frontside of the group III-V device 102. Further, the first and second Bragg reflectors 130, 132 are defined by a plurality of first reflector layers 136 and a plurality of second reflector layers 138. For ease of illustration, only one of the first reflector layers 136 is labeled 136 and only one of the second reflector layers 138 is labeled 138. The first reflector layers 136 are alternatingly stacked with second reflector layers 138 and may, for example, have a different property (e.g., refractive index or some other suitable property) than the second reflector layers 138. The first and second reflector layers 136, 138 may be or comprise, for example, aluminum gallium arsenide, some other suitable group III-V material(s), or any combination of the foregoing.

In some embodiments, the first reflector layers 136 are each $Al_xGaAs$, where x is about 0.0-0.9. Further, in some embodiments, the first reflector layers 136 each have a thickness between about 4-100 nanometers or some other suitable thickness(es). In some embodiments, the second reflector layers 138 are each $Al_xGaAs$, where x is about 0.1-1.0. Further, in some embodiments, the second reflector layers 138 each have a thickness between about 4-100 nanometers or some other suitable thickness(es). In some embodiments, first and second reflector layers 136, 138 defining the second Bragg reflector 132 are P type, whereas first and second reflector layers 136, 138 defining the first Bragg reflector 130 are N type, or vice versa. In some embodiments, a reflector layer pair 140 on the frontside of the group III-V device 102 repeats about 0-100 times to enlarge the second Bragg reflector 132, and/or a reflector layer pair (not labeled) on the backside of the group III-V device 102 repeats about 0-100 times to enlarge the first Bragg reflector 130.

With reference to FIG. 2, a top view 200 of some embodiments of the frontside contact 122 is provided. The frontside contact 122 has a ring-shaped layout and is on the mesa structure 108. Alternative layouts are, however, amenable in other embodiments. In some embodiments, an inner dimeter ID of the frontside contact 122 is about 8-10 micrometers, about 9 micrometers, or some other suitable value. In some embodiments, an outer diameter OD of the frontside contact is about 10-14 micrometers, about 12 micrometers, or some other suitable value. When viewed in cross-section (see, e.g., FIG. 1), the frontside contact 122 may, for example, directly contact the mesa structure 108. In some of such embodiments, the contact area between the mesa structure 108 and the frontside contact 122 is about 50-200 square micrometers, about 50 square micrometers, or some other suitable area.

With reference to FIG. 3, a top view 300 of some embodiments of the mesa-side and substrate-side bumps 112, 114 is provided. The mesa-side bump 112 is on the substrate-side bump 114 and, in some embodiments, the mesa-side and substrate-side bumps 112, 114 have an overlay shift OS. The overlay shift OS may, for example, be about 0-6 micrometers, about 1-6 micrometers, or some other suitable overlay shift. Further, the mesa-side and substrate-side bumps 112, 114 have circular layouts. Alternative layouts are, however, amenable in other embodiments. In some embodiments, a diameter D1 of the mesa-side bump 112 is about 10-14 micrometers, about 12 micrometers, or some other suitable value. In some embodiments, a diameter D2 of the substrate-side bump 114 is the same as or about the same as the diameter D1 of the mesa-side bump 112, and/or is about 10-14 micrometers, about 12 micrometers, or some other suitable value. When viewed in cross-section (see, e.g., FIG. 1), the mesa-side and substrate-side bumps 112, 114 may, for example, directly contact. In some of such embodiments, the contact area between the mesa-side and substrate-side bumps 112, 114 is about 44-114 square micrometers, about 400-500 square micrometers, or some other suitable area.

With reference to FIG. 4A, a cross-sectional view 400A of some alternative embodiments of the integrated chip of FIG. 1 is provided in which the mesa-side bump 112 protrudes through an etch stop layer 402 to the diffusion layer 118. The etch stop layer 402 may be or comprise, for example, silicon nitride, silicon oxide, silicon oxynitride, some other suitable dielectric(s), some other suitable etch stop material(s), or any combination of the foregoing. The etch stop layer 402 may, for example, have a thickness of about 10-500 nanometers or some other suitable thickness(es). In some embodiments, the mesa-side bump 112 wraps around corners of the etch stop layer 402 and/or has a greater width than the substrate-side bump 114. In some embodiments, the second bump segment 112*b* of the mesa-side bump 112 has a greater width than the first bump segment 112*a* of the mesa-side bump 112, and/or the first bump segment 112*a* has a greater width than the substrate-side bump 114.

As seen hereafter, the etch stop layer 402 is used as an etch stop during formation of the mesa structure 108. For example, an etching process may be performed into a stack of one or more group III-V layers, and may stop on the etch stop layer, to form the mesa structure 108 from a mesa area of the group III-V stack. Further, as seen hereafter, the etch stop layer 402 may cause the diffusion layer 118 to form spaced from a side boundary of the mesa area. This, in turn, allows the etching process to be performed without etching through the diffusion layer 118. Therefore, in embodiments in which group III-V material from the mesa structure 108 and metal from the mesa-side bump 112 combine in such a way that the diffusion layer 118 is difficult to etch and/or remove by wet etching, the challenges (discussed with regard to FIG. 1) associated with ion bombardment may be avoided.

Figure 4B:
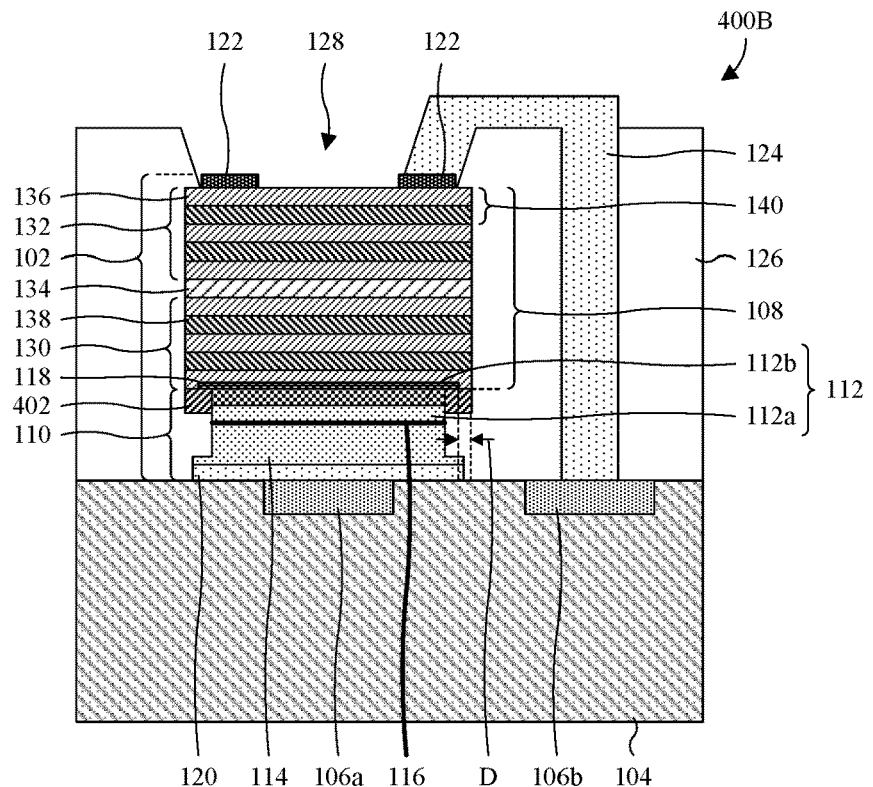

With reference to FIG. 4B, a cross-sectional view 400B of some alternative embodiments of the integrated chip of FIG. 4A is provided in which the mesa-side bump 112 does not wrap around corners of the etch stop layer 402. Further, in some embodiments, the bump structure 110 increases in width from top to bottom and/or the substrate-side bump 114 has an inverted T-shaped profile. Other profiles are, however, amenable in other embodiments.

As seen hereafter, the mesa-side bump 112 may be formed by a metal liftoff process before forming the mesa structure 108. By forming the mesa-side bump 112 as such, the mesa-side bump 112 and the substrate-side bump 114 are not subject to damage by etching to form the mesa-side bump 112. As discussed with regard to FIG. 1 such damage may lead to a small contact area between the mesa-side and substrate-side bumps 112, 114 at the bond interface 116. Further, resistance between the mesa-side and substrate-side bumps 112, 114 may be high and power efficiency may be low. Therefore, forming the mesa-side bump 112 by the metal liftoff process before forming the mesa structure 108 may lead to low resistance between the mesa-side and substrate-side bumps 112, 114 and may lead to power efficiency that is high.

Figure 5A:
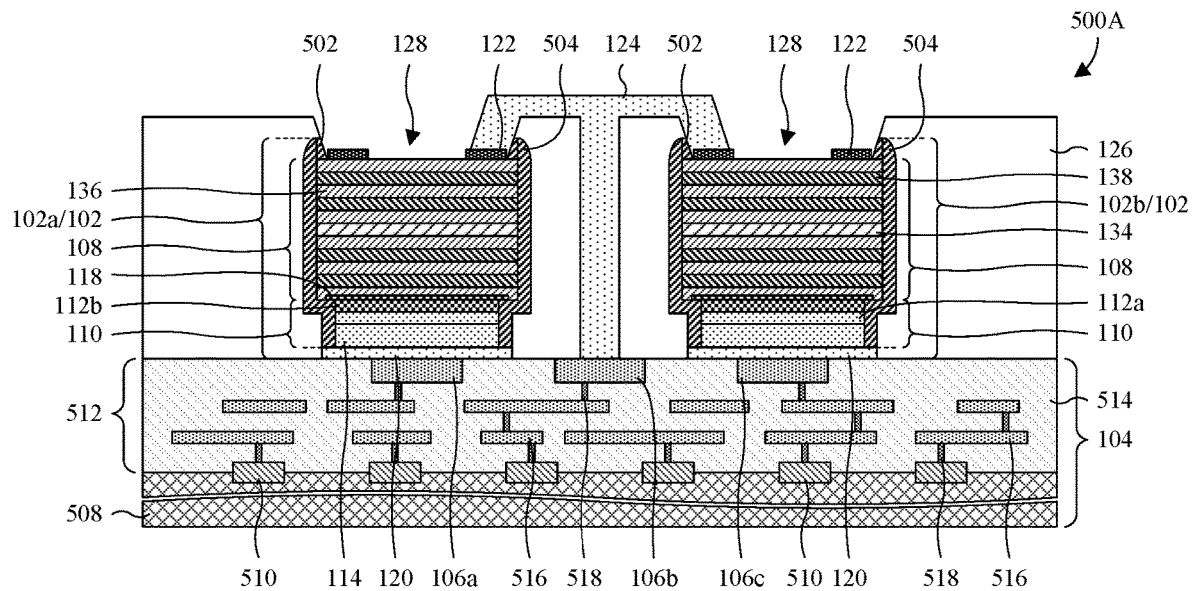
FIGS. 5A-5C illustrate cross-sectional views of various embodiments of integrated chips comprising multiple group III-V devices bonded to a substrate and configured respectively according to more detailed embodiments of the group III-V devices of FIGS. 1, 4A, and 4B.

With reference to FIG. 5A, a cross-sectional view 500A of some embodiments of an integrated chip comprising a first group III-V device 102*a* and a second group III-V device 102*b* bonded to a substrate 104 is provided. The first group III-V device 102*a* overlies and is electrically coupled to a first pad 106*a*, and the second group III-V device 102*b* overlies and is electrically coupled to a third pad 106*c*. Further, a second pad 106*b* is between the first and second group III-V devices 102*a*, 102*b* and is electrically coupled to the first and second group III-V devices 102*a*, 102*b* by a conductive structure 124. In some embodiments, the conductive structure 124 has a T-shaped profile, but other profiles are amenable in other embodiments.

The first and second group III-V devices 102a, 102b are configured according to more detailed embodiments of the group III-V device 102 of FIG. 1 and hence further comprise hard masks 502 and sidewall spacers 504. The hard masks 502 overly mesa structures 108 and, in some embodiments, at least partially defines contact openings 128. The sidewall spacers 504 line sidewalls of the mesa structures 108 and sidewalls of bump structures 110. As seen hereafter, the hard masks 502 may, for example, be employed as masks to define the mesa structures 108, and/or the sidewall spacers 504 may, for example, protect the mesa structures 108 and the bump structures 110 while defining backside contacts 120. The hard masks 502 and the sidewall spacers 504 may be or comprise, for example, silicon nitride, silicon oxide, silicon oxynitride, some other suitable dielectric(s), or any combination of the foregoing. In some embodiments, the hard masks 502 and the sidewall spacers 504 are the same material.

The substrate 104 comprises a semiconductor substrate 508, a plurality of semiconductor devices 510 over the semiconductor substrate 508, and an interconnect structure 512 over the semiconductor substrate 508 and the semiconductor devices 510. For ease of illustration, only some of the semiconductor devices 510 are labeled 510. The semiconductor substrate 508 may be, for example, a bulk monocrystalline silicon substrate, a silicon-on-insulator (SOI) substrate, or some other suitable semiconductor substrate. The semiconductor devices 510 may be or comprise, for example, metal-oxide-semiconductor field-effector transistors (MOSFETs), some other suitable metal-oxide-semiconductor (MOS) devices, some other suitable insulated-gate field-effector transistors (IGFETs), CMOS devices, some other suitable semiconductor devices, or any combination of the foregoing.

The interconnect structure 512 comprises an interconnect dielectric layer 514, a plurality of wires 516, a plurality of vias 518, and a plurality of pads. For ease of illustration, only some of the wires 516 are labeled 516 and only some of the vias 518 are labeled 518. The interconnect dielectric layer 514 may be or comprise, for example, borophosphosilicate glass (BPSG), phosphor-silicate glass (PSG), undoped silicon glass (USG), some other low κ dielectric, silicon oxide, silicon carbide, some other suitable dielectric(s), or any combination of the foregoing. As used herein, a low κ dielectric may be or comprise, for example, a dielectric with a dielectric constant κ less than about 3.9, 3, 2, or 1. The pads comprise the first, second, and third pads 106a, 106b, 106c, and the wires 516, the vias 518, and the pads are alternatingly stacked in the interconnect dielectric layer 514. The wires 516 and the vias 518 define conductive paths interconnecting the semiconductor devices 510 and/or connecting the semiconductor devices 510 to the pads. The wires 516, the vias 518, and the pads may be or comprise, for example, copper, aluminum copper, aluminum, titanium, tungsten, some other suitable metal(s), or any combination of the foregoing.

Figure 5B:
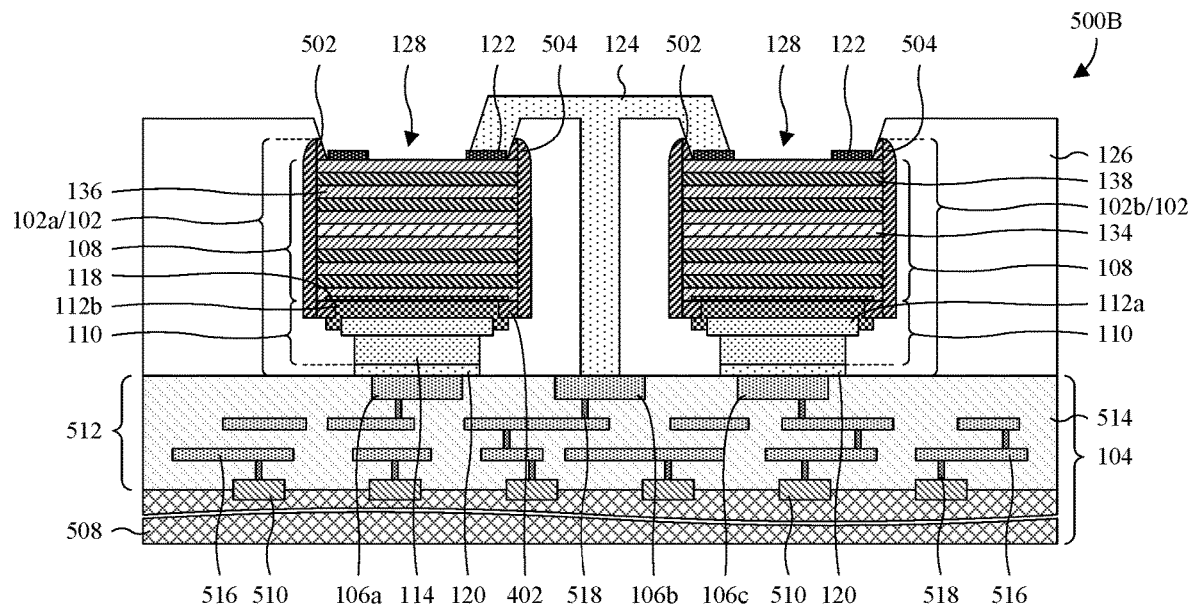

With reference to FIG. 5B, a cross-sectional view 500B of some alternative embodiments of the integrated chip of FIG. 5A is provided in which the first and second group III-V devices 102a, 102b are configured according to more detailed embodiments of the group III-V device 102 of FIG. 4A. As in FIG. 5A, the hard masks 502 are on the mesa structures 108 and the sidewall spacers 504 are on sidewalls of the mesa structures 108. However, in contrast with FIG. 5A, the sidewall spacers 504 are not on sidewalls of the bump structure 110.

Figure 5C:
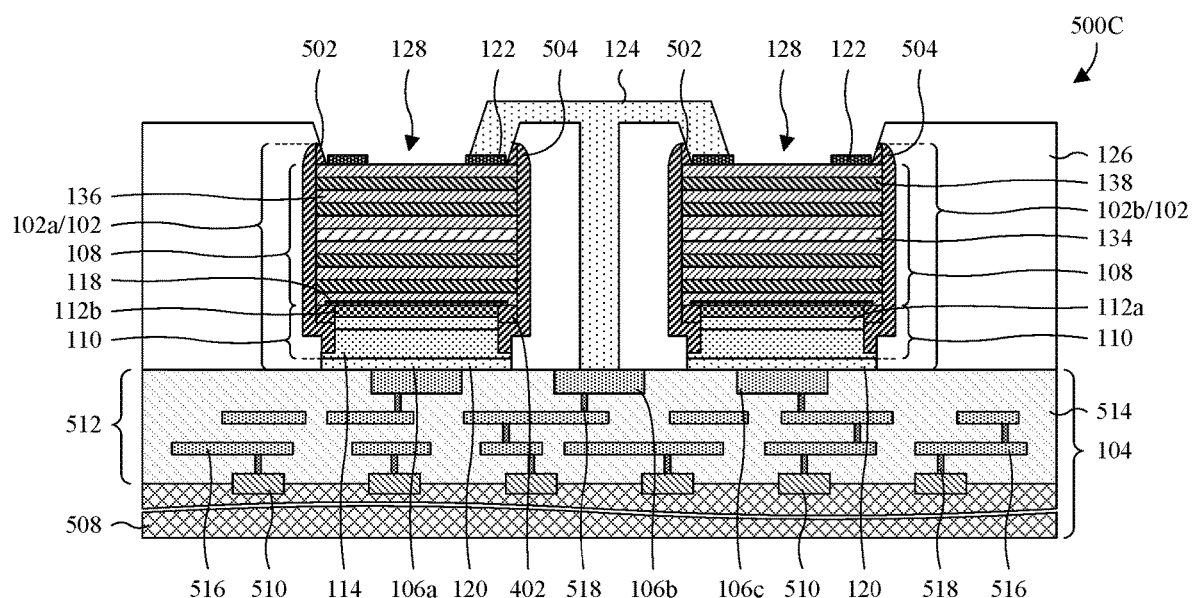

With reference to FIG. 5C, a cross-sectional view 500C of some alternative embodiments of the integrated chip of FIG. 5A is provided in which the first and second group III-V devices 102a, 102b are configured according to more detailed embodiments of the group III-V device 102 of FIG. 4B. As in FIG. 5A, the hard masks 502 are on the mesa structures 108 and the sidewall spacers 504 are on sidewalls of the mesa structures 108 and sidewalls of the bump structures 110. However, in contrast with FIG. 5A, the bump structures 110 have an inverted T-shaped profile. Other suitable profiles are, however, amenable in other embodiments.

While FIGS. 1, 4A, and 4B describe a group III-V device 102, it is to be appreciated that a device based on semiconductor materials other than group III-V materials may be used in place of the group III-V device 102. For example, a silicon-based device may be used in place of the group III-V device 102, whereby the mesa structure 108 may be or comprise silicon. Similarly, while 5A-5C describe first and second group III-V devices 102a, 102b, it is to be appreciated that devices based on semiconductor materials other than group III-V materials may be used in place of the first and second group III-V devices 102a, 102b.

With reference to FIGS. 6A, 6B, 7A, 7B, 8, 9A, 9B, 10, 11A, 11B, and 12-25, a series of views illustrates some embodiments of a method for forming an integrated chip comprising multiple group III-V devices bonded to a substrate with pre-patterned mesa-side bumps. In other embodiments, the method may form and/or use devices based on semiconductor materials other than group III-V materials in place of the group III-V devices. The integrated chip may, for example, be as illustrated and described with regard to FIG. 5A. While FIGS. 6A, 6B, 7A, 7B, 8, 9A, 9B, 10, 11A, 11B, and 12-25 are described with reference to a method, it will be appreciated that the structures shown in FIGS. 6A, 6B, 7A, 7B, 8, 9A, 9B, 10, 11A, 11B, and 12-25 are not limited to the method and may stand alone.

Figure 6A:
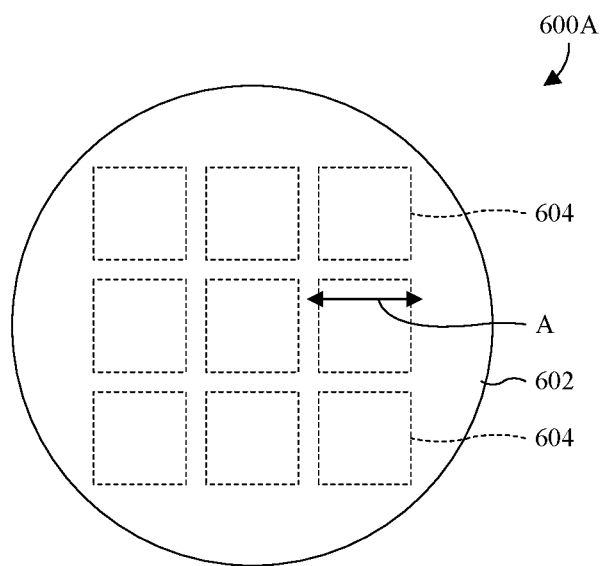
FIGS. 6A, 6B, 7A, 7B, 8, 9A, 9B, 10, 11A, 11B, and 12-25 illustrate a series of views of some embodiments of a method for forming an integrated chip comprising multiple group III-V devices bonded to a substrate with pre-patterned mesa-side bumps.
Figure 6B:
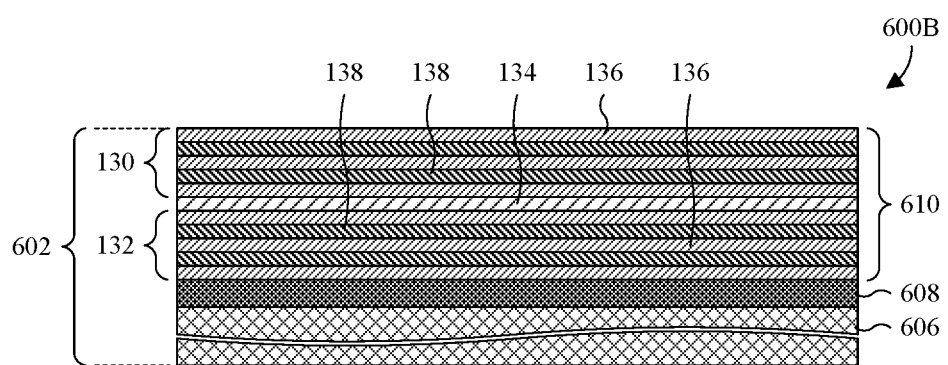

As illustrated by the views 600A, 600B of FIGS. 6A and 6B, a first workpiece 602 is formed. FIG. 6A illustrates a top layout 600A of some embodiments of the first workpiece 602, and FIG. 6B illustrates a cross-sectional view 600B of some embodiments of the first workpiece 602 taken along line A in FIG. 6A.

With focus on FIG. 6A, the first workpiece 602 includes a plurality of die regions 604. For ease of illustration, only some of the die regions 604 are labeled 604. The die regions 604 may, for example, each have the same layout and/or configuration. In some embodiments, the first workpiece 602 has circular top layout and/or a diameter of about 6 inches. In other embodiments, the first workpiece 602 has some other top layout and/or some other dimensions.

With focus on FIG. 6B, the first workpiece 602 further includes a first semiconductor substrate 606, a first etch stop layer 608, and an epitaxial stack 610. The first etch stop layer 608 overlies the first semiconductor substrate 606, and the epitaxial stack 610 overlies the first etch stop layer 608. At least at this stage of the method, the first semiconductor substrate 606 may, for example, also be referred to as a first semiconductor wafer. The first semiconductor substrate 606 may, for example, be a gallium arsenide substrate, some other suitable group III-V substrate, or some other suitable semiconductor substrate. Further, the first semiconductor substrate 606 may, for example, have a thickness of about 200 micrometers, but other thicknesses are amenable in other embodiments. The first etch stop layer 608 may, for example, be or comprise indium gallium phosphide (InGaP), some other suitable group III-V material(s), some other suitable etch stop material(s), or any combination of the foregoing. The epitaxial stack 610 comprises one or more epitaxial layers. Further, the epitaxial stack 610 may be or comprise, for example, aluminum gallium arsenide, indium gallium arsenide, some other suitable group III-V material(s), some other suitable semiconductor material(s), or any combination of the foregoing.

In some embodiments, VCSELs are formed from the epitaxial stack 610. In some of such embodiments, the epitaxial stack 610 comprises a first Bragg reflector 130, a second Bragg reflector 132, and an active layer 134. The active layer 134 is sandwiched between the first and second Bragg reflectors 130, 132. The active layer 134 may, for example, comprise one or more quantum wells and/or may, for example, comprise indium gallium arsenide and/or in some other suitable group III-V material(s). The first and second Bragg reflectors 130, 132 are defined by a plurality of first reflector layers 136 and a plurality of second reflector layers 138. For ease of illustration, only some of the first reflector layers 136 are labeled 136 and only some of the second reflector layers 138 are labeled 138. The first reflector layers 136 are alternatingly stacked with second reflector layers 138 and may, for example, have a different property (e.g., refractive index or some other suitable property) than the second reflector layers 138. The first and second reflector layers 136, 138 may be or comprise, for example, aluminum gallium arsenide, some other suitable group III-V material(s), or any combination of the foregoing.

Figure 7A:
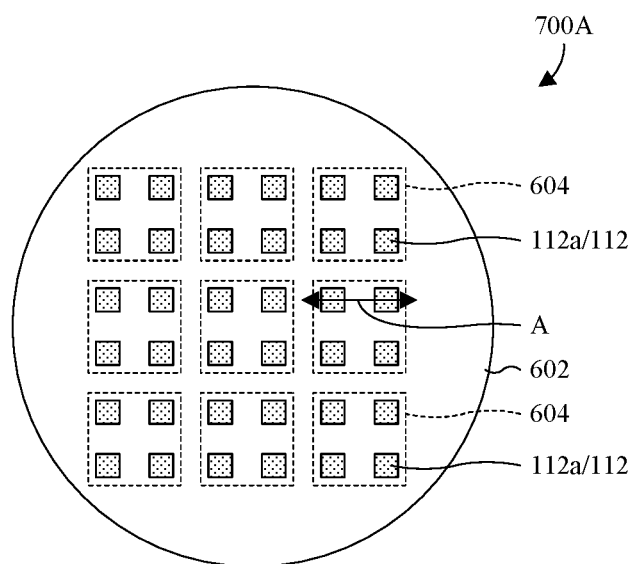
Figure 7B:
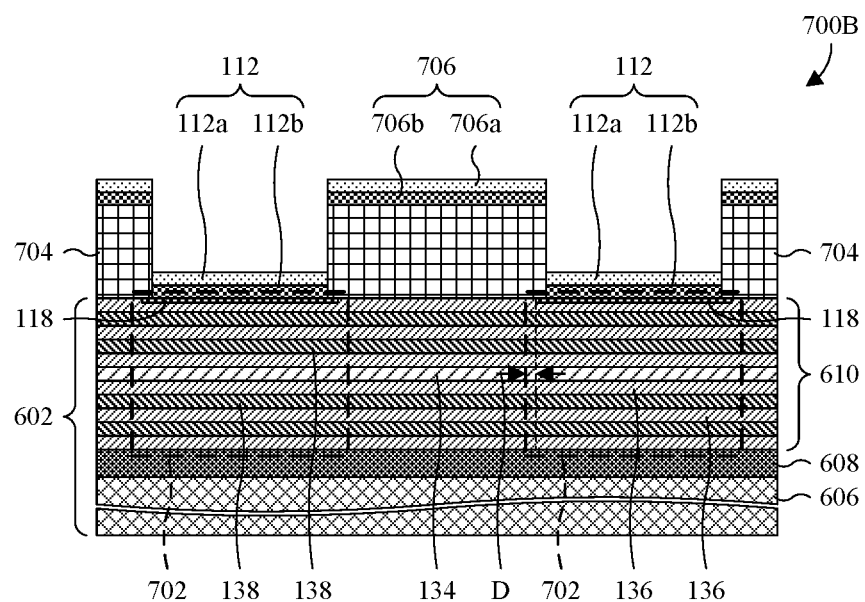

As illustrated by the views 700A, 700B of FIGS. 7A and 7B, mesa-side bumps 112 are formed on the first workpiece 602, at mesa areas 702 (see FIG. 7B) of the first workpiece 602. FIG. 7A illustrates a top layout 700A of some embodiments of the first workpiece 602 and the mesa-side bumps 112, and FIG. 7B illustrates a cross-sectional view 700B of some embodiments of the first workpiece 602 and the mesa-side bumps 112 taken along line A in FIG. 7A. For ease of illustration, only some of the mesa-side bumps 112 are labeled 112 in FIG. 7A. The mesa-side bumps 112 are conductive and may be or comprise, for example, nickel, gold, some other metal(s), or any combination of the foregoing. In some embodiments, the mesa-side bumps 112 comprise individual first bump segments 112a and individual second bump segments 112b underlying the first bump segments 112a. The first bump segments 112a may be or comprise, for example, gold and/or some other suitable metal(s), and/or the second bump segments 112b comprise nickel, gold, some other suitable metal(s), or any combination of the foregoing.

In some embodiments, upon forming the mesa-side bumps 112, material of the mesa-side bumps 112 diffuses into the epitaxial stack 610 and defines diffusion layers 118 individual to the mesa-side bumps 112. Therefore, the diffusion layers 118 comprise material from both the epitaxial stack 610 and the mesa-side bumps 112. For example, the diffusion layer 118 may comprise germanium, gallium, arsenide, or any combination of the foregoing from the epitaxial stack 610, and/or may comprise nickel, gold, or any combination of the foregoing from the mesa-side bumps 112. In some embodiments, materials from both the epitaxial stack 610 and the material from the mesa-side bumps 112 combine in such a way that the diffusion layers 118 are difficult to etch and/or remove by a wet etchant.

With focus on FIG. 7B, the mesa-side bumps 112 are formed by a metal liftoff process in some embodiments. Other approaches to forming the mesa-side bumps 112 are, however, amenable in other embodiments. In some embodiments, the metal liftoff process comprises: forming a photoresist mask 704 with openings at the mesa areas 702 on the epitaxial stack 610; depositing a mesa-side bump layer 706 on the photoresist mask 704 and in the openings while the photoresist mask 704 is in place; and removing the photoresist mask 704. In some embodiments, the mesa-side bump layer 706 comprises a first mesa-side bump layer 706a and a second mesa-side bump layer 706b respectively corresponding to the first bump segments 112a and the second bump segments 112b. By removing the photoresist mask 704, portions of the mesa-side bump layer 706 on the photoresist mask 704 are lifted off while portions of the mesa-side bump layer 706 in the openings remain to define the mesa-side bumps 112. The depositing may, for example, be performed by sputtering, electron-beam physical vapor deposition (EBPVD), some other suitable deposition process(es), or any combination of the foregoing.

By forming the mesa-side bumps 112 by the metal liftoff process, metal may only diffuse into a portion of the epitaxial stack 610 localized to the mesa-side bumps 112. As such, the diffusion layers 118 may be formed spaced from side boundaries of the mesa areas 702 by a distance D. As seen hereafter, this allows formation of mesa structures without ion bombardment, which is messy and leads to a slew of problems.

Figure 8:
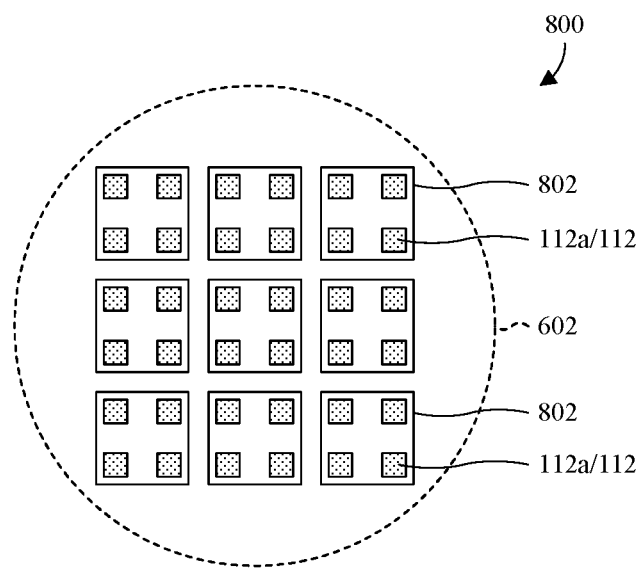

As illustrated by the top layout 800 of FIG. 8, the die regions 604 (see FIG. 7A) of the first workpiece 602 (shown in phantom) are separated into chips 802. The separation may, for example, be performed by a die saw or some other suitable tool.

Figure 9A:
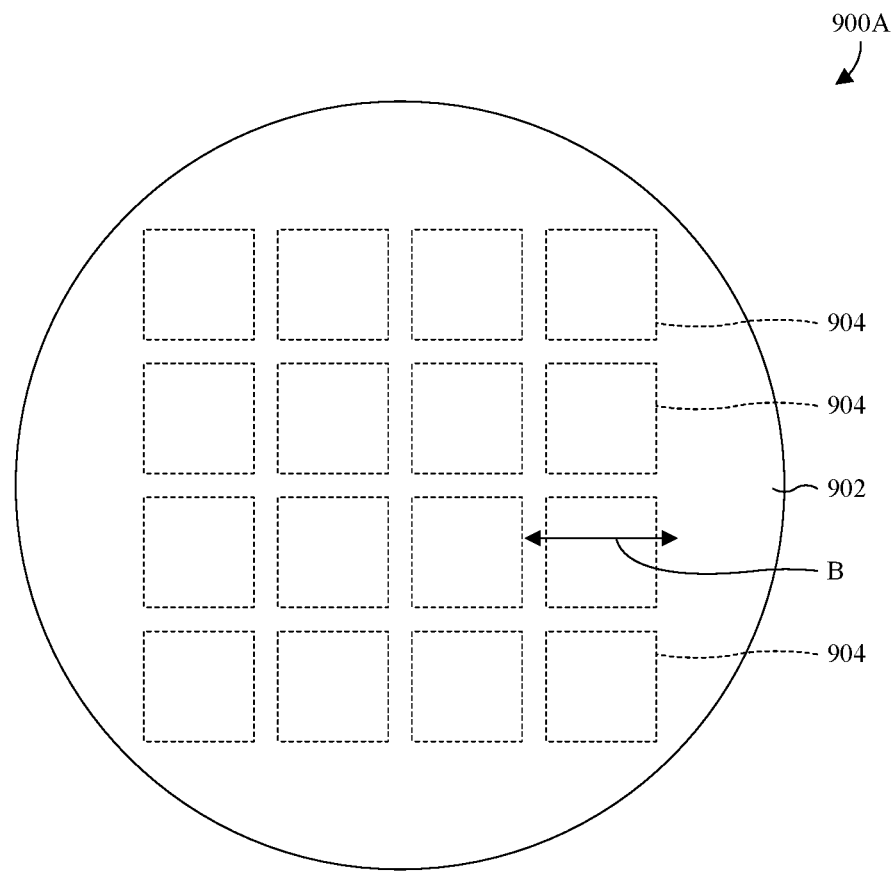
Figure 9B:
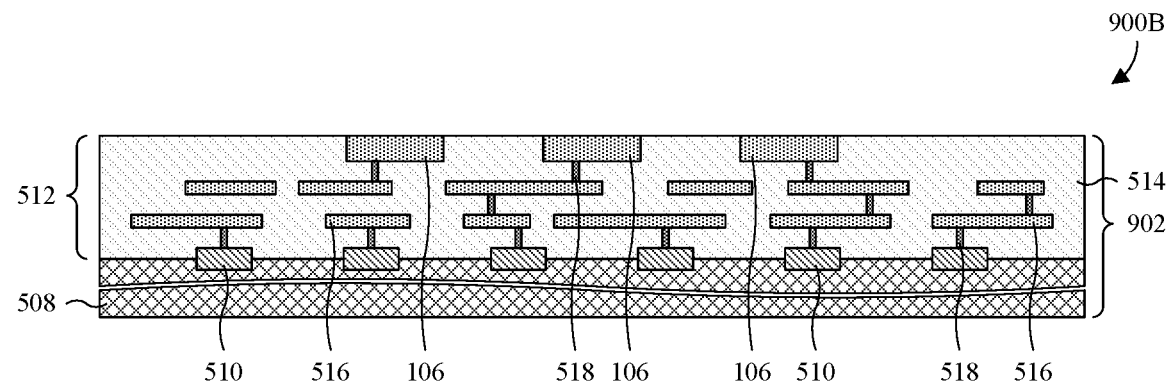

As illustrated by the views 900A, 900B of FIGS. 9A and 9B, a second workpiece 902 is formed. FIG. 9A illustrates a top layout 900A of some embodiments of the second workpiece 902, and FIG. 9B illustrates a cross-sectional view 900B of some embodiments of the second workpiece 902 taken along line B in FIG. 9A.

With focus on FIG. 9A, the second workpiece 902 includes a plurality of die regions 904. For ease of illustration, only some of the die regions 904 are labeled 904. The die regions 904 may, for example, each have the same layout and/or configuration. In some embodiments, the second workpiece 902 has circular top layout and/or a diameter of about 12 inches. In other embodiments, the second workpiece 902 has some other top layout and/or some other dimensions. In some embodiments in which the first workpiece 602 of FIG. 6A and the second workpiece 902 have circular top layouts, the second workpiece 902 has a larger diameter than that of the first workpiece 602.

With focus on the cross-sectional view 900B of FIG. 9B, the second workpiece 902 further includes a second semiconductor substrate 508, a plurality of semiconductor devices 510 over the second semiconductor substrate 508, and an interconnect structure 512 over the second semiconductor substrate 508 and the semiconductor devices 510. For ease of illustration, only some of the semiconductor devices 510 are labeled 510. At least at this stage of the method, the second semiconductor substrate 508 may, for example, also be referred to as a second semiconductor wafer. The second semiconductor substrate 508 may be, for example, a bulk monocrystalline silicon substrate, a SOI substrate, or some other suitable semiconductor substrate. The semiconductor devices 510 may be or comprise, for example, CMOS devices, some other suitable semiconductor devices, or any combination of the foregoing.

The interconnect structure 512 comprises an interconnect dielectric layer 514, a plurality of wires 516, a plurality of vias 518, and a plurality of pads 106. For ease of illustration, only some of the wires 516 are labeled 516 and only some of the vias 518 are labeled 518. The wires 516, the vias 518, and the pads 106 are alternatingly stacked in the interconnect dielectric layer 514, and the wires 516 and the vias 518 define conductive paths interconnecting the semiconductor devices 510 and/or connecting the semiconductor devices 510 to the pads 106. The wires 516, the vias 518, and the pads 106 may be or comprise, for example, copper, aluminum copper, aluminum, titanium, tungsten, some other suitable metal(s), some other suitable conductive material(s), or any combination of the foregoing.

Figure 10:
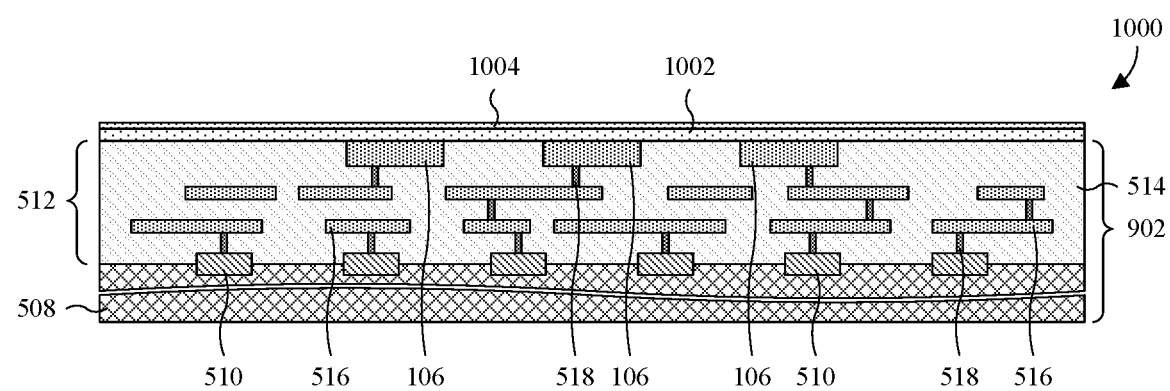

As illustrated by the cross-sectional view 1000 of FIG. 10, a first contact layer 1002 and a seed layer 1004 are formed stacked over the second workpiece 902. The seed layer 1004 overlies the first contact layer 1002 and may be or comprise, for example, gold, some other suitable metal(s), some other suitable conductive material(s), or any combination of the foregoing. The first contact layer 1002 may be or comprise, for example, titanium, tungsten, copper, some other suitable metal(s), some other suitable conductive material(s), or any combination of the foregoing. The first contact layer 1002 and the seed layer 1004 may, for example, be formed by chemical vapor deposition (CVD), physical vapor deposition (PVD), some other suitable deposition process(es), or any combination of the foregoing.

Figure 11A:
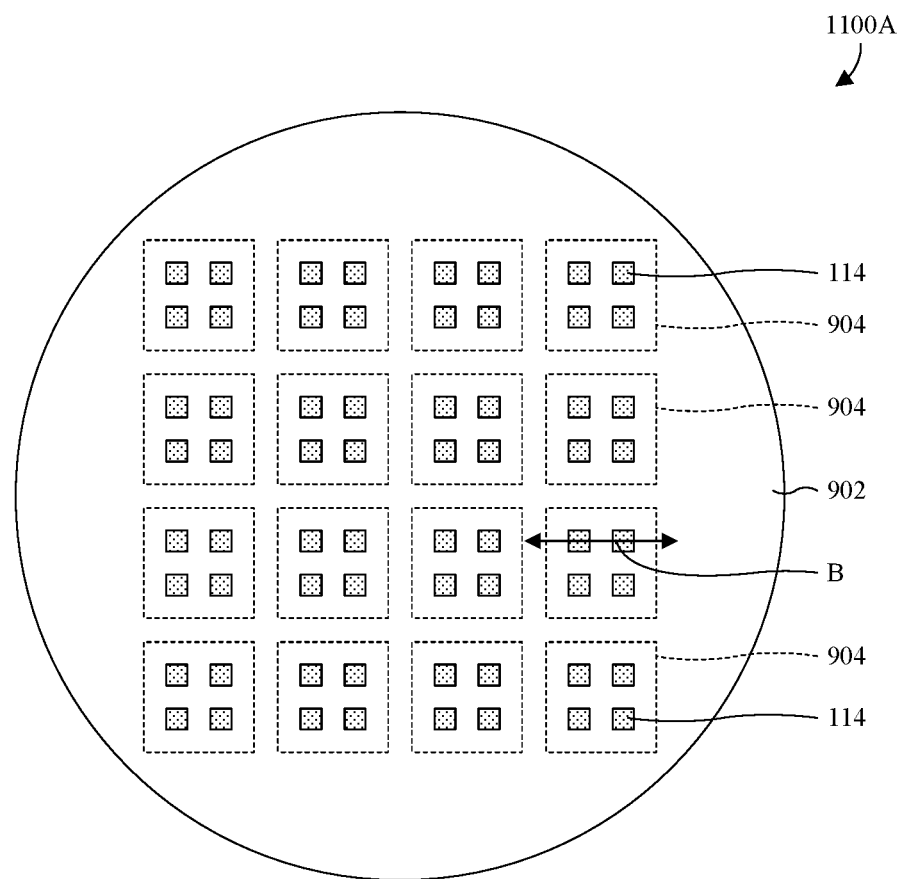
Figure 11B:
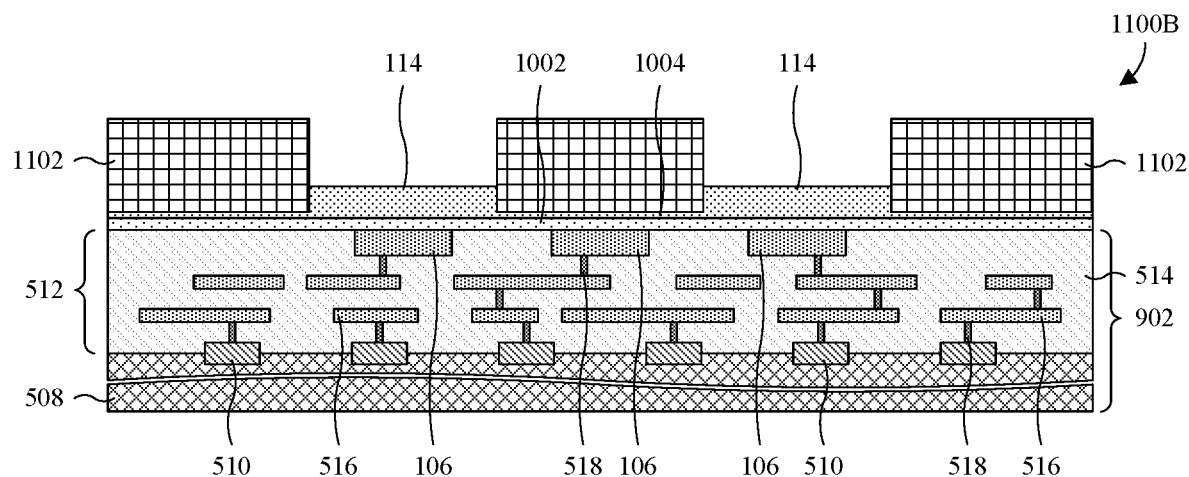

As illustrated by the views 1100A, 1100B of FIGS. 11A and 11B, substrate-side bumps 114 are formed on the second workpiece 902, at corresponding pads 106 (see FIG. 11B) of the second workpiece 902. FIG. 11A illustrates a top layout 1100A of some embodiments of the second workpiece 902 and the substrate-side bumps 114, and FIG. 11B illustrates a cross-sectional view 1100B of some embodiments of the second workpiece 902 and the substrate-side bumps 114 taken along line B in FIG. 11A. For ease of illustration, only some of the substrate-side bumps 114 are labeled 114 in FIG. 11A. The substrate-side bumps 114 are conductive and are or comprise the same material as the seed layer 1004 (see FIG. 11B).

With focus on FIG. 11B, the substrate-side bumps 114 are formed by a plating process. Other approaches to forming the substrate-side bumps 114 are, however, amenable in other embodiments. In some embodiments in which the substrate-side bumps 114 are formed by the plating process, a photoresist mask 1102 is formed on the seed layer 1004 with openings at the pads 106 corresponding to the substrate-side bumps 114. The plating process is then performed to grow the substrate-side bumps 114 from the seed layer 1004 while the photoresist mask 1102 is in place, and the photoresist mask 1102 is subsequently removed. The plating process may, for example, be electroplating, electroless plating, or some other suitable plating process.

Figure 12:
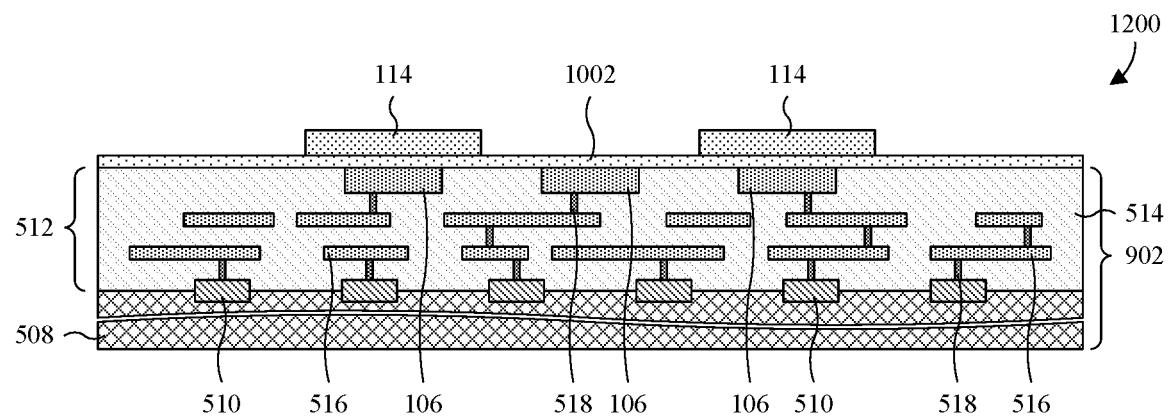

As illustrated by the cross-sectional view 1200 of FIG. 12, an etch back is performed to remove the seed layer 1004 (see FIG. 11B) while leaving the substrate-side bumps 114. The etch back may, for example, be performed by a wet etch or trim and/or some other suitable etching process(es).

Figure 13:
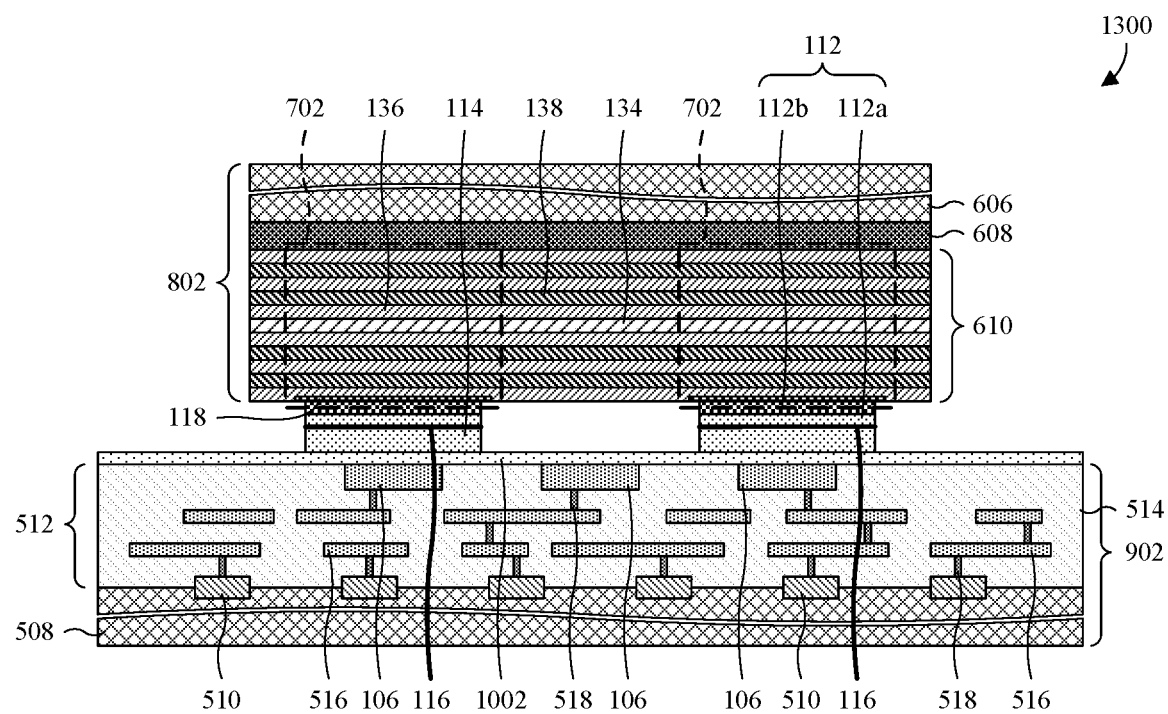

As illustrated by the cross-sectional view 1300 of FIG. 13, a chip 802 of the first workpiece 602 (see FIG. 8) is flipped vertically and bonded to the second workpiece 902 at a bond interface 116 at which the substrate-side bumps 114 and the mesa-side bumps 112 contact. In embodiments in which the second semiconductor substrate 508 is a wafer, the bonding may, for example, be referred to as chip-to-wafer (C2W) bonding. The bonding may, for example, be performed by a metal-to-metal bonding and/or some other suitable bonding process(es).

As illustrated by the cross-sectional view 1400 of FIG. 14, a protective layer 1402 is formed around the chip 802 and having a top surface recessed below that of the chip 802. The protective layer 1402 may, for example, be or comprise an organic anti-reflective coating (ARC), an inorganic ARC, some other suitable protective material(s), or any combination of the foregoing. The protective layer 1402 may, for example, be formed by sputtering, CVD, PVD, some other suitable deposition process(es), or any combination of the foregoing.

Figure 14:
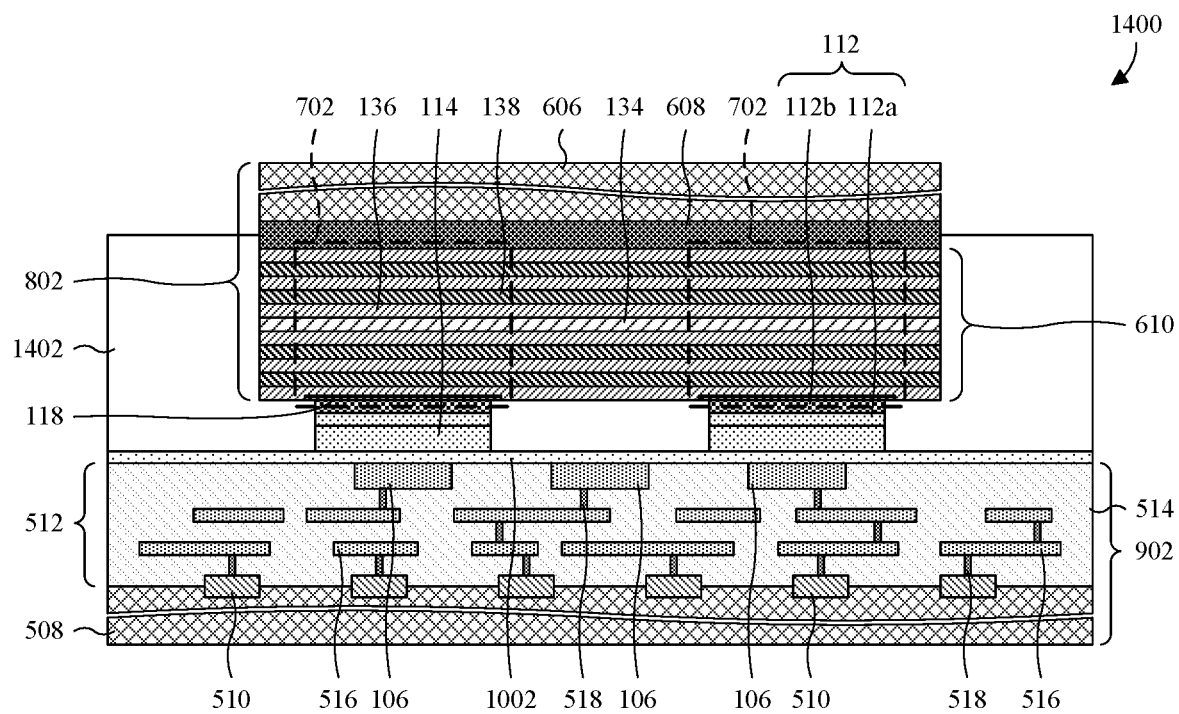
Figure 15:
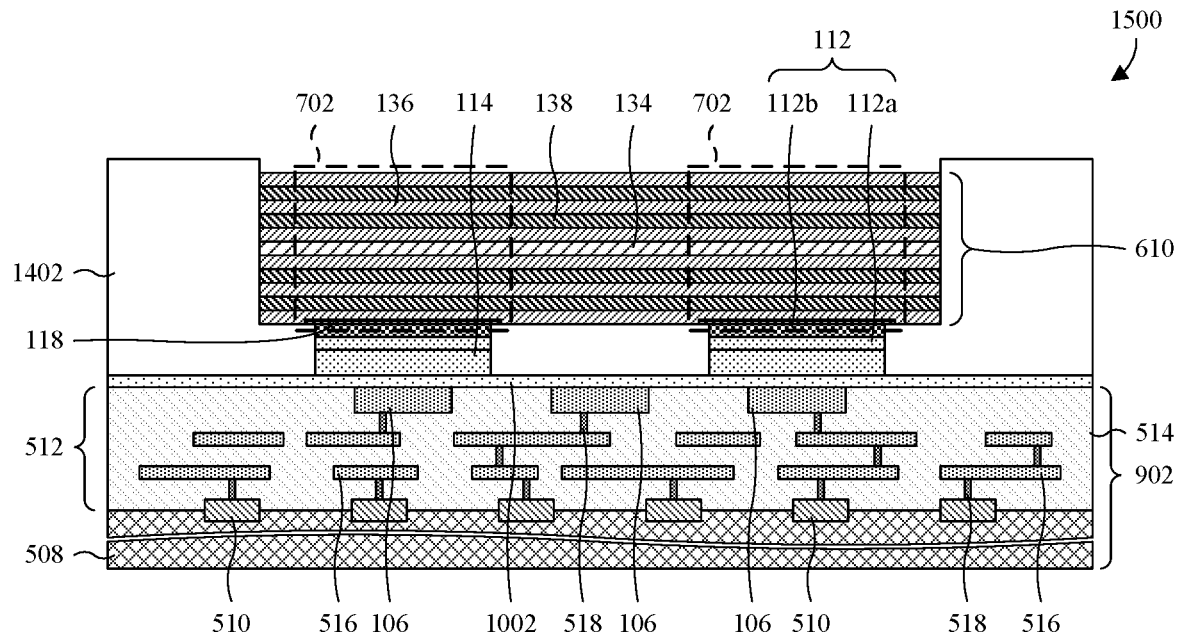

As illustrated by the cross-sectional view 1500 of FIG. 15, an etching process is performed into the first semiconductor substrate 606 (see FIG. 14) and the first etch stop layer 608 (see FIG. 14) with the protective layer 1402 in place to remove the first semiconductor substrate 606 and the first etch stop layer 608. In some embodiments, the etching process comprises performing a first etch to the first semiconductor substrate 606 to remove the first semiconductor substrate 606, and subsequently performing a second etch into the first etch stop layer 608 to remove the first etch stop layer 608. In such embodiments, the first etch stop layer 608 may, for example, serve as an etch stop for the first etch. In other embodiments, the etching process is limited to a single etch or comprises more than the first and second etches.

Figure 16:
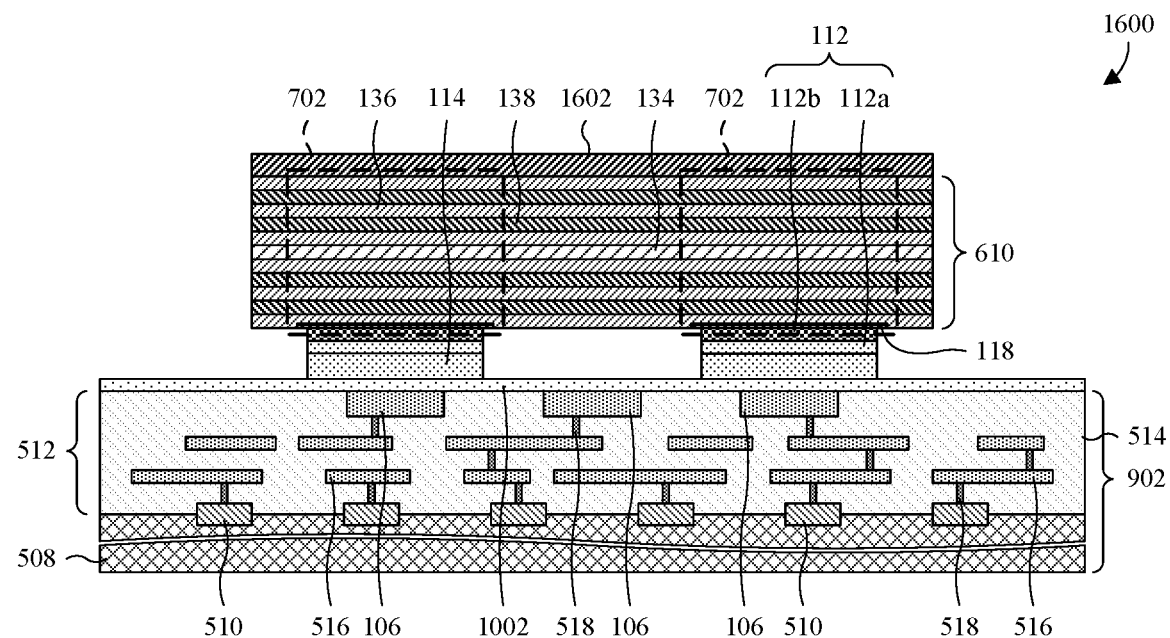

As illustrated by the cross-sectional view 1600 of FIG. 16, the protective layer 1402 (see FIG. 15) is removed. The removal may, for example, be performed by an etching process and/or some other suitable removal process(es).

Also illustrated by the cross-sectional view 1600 of FIG. 16, a hard mask layer 1602 is formed on the epitaxial stack 610. The hard mask layer 1602 may be or comprise, for example, silicon oxide, silicon nitride, silicon oxynitride, some other suitable hard mask material(s), or any combination of the foregoing. The hard mask layer 1602 may, for example, be formed by CVD, PVD, oxidation, some other suitable deposition process(es), or any combination of the foregoing. In some embodiments, the hard mask layer 1602 is localized to a top surface of the epitaxial stack 610. In some of such embodiments, the hard mask layer 1602 is deposited by plasma-enhanced PVD to achieve such localization.

Figure 17:
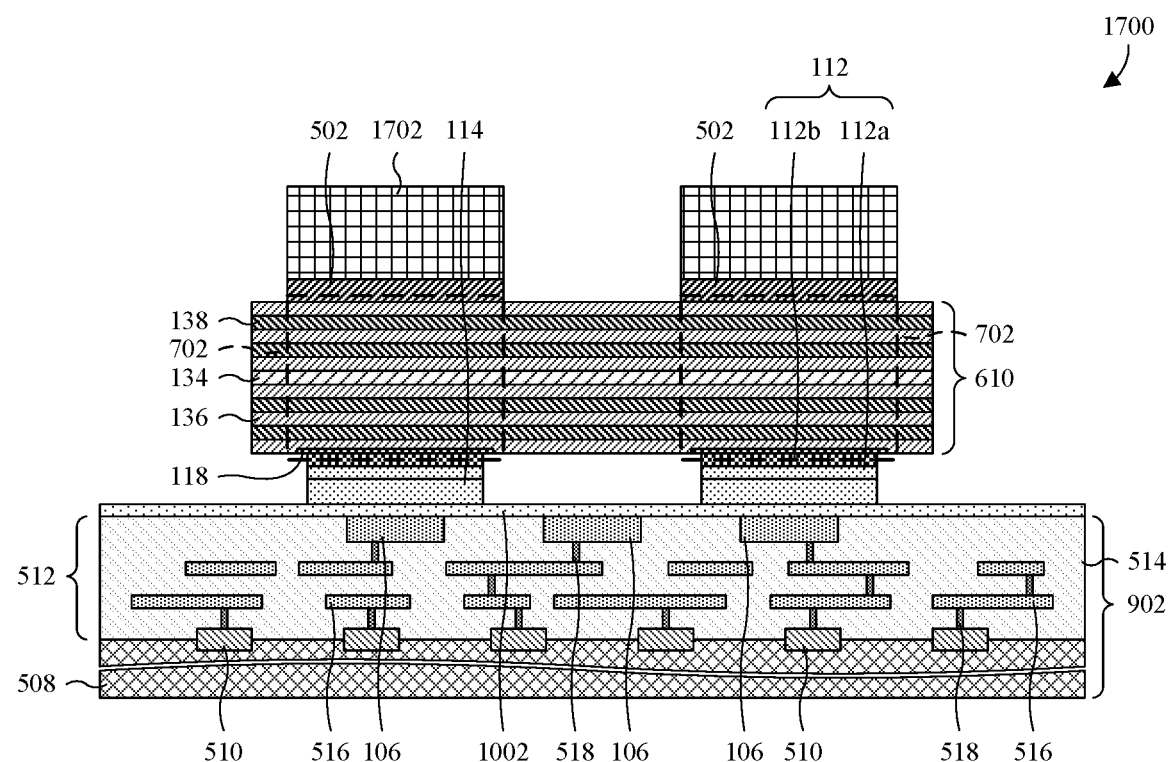

As illustrated by the cross-sectional view 1700 of FIG. 17, the hard mask layer 1602 (see FIG. 16) is patterned to from hard masks 502 on the mesa areas 702 of the epitaxial stack 610. The patterning may, for example, be performed by a photolithography/etching process and/or some other suitable patterning process(es). The photolithography/etching process may, for example, comprise forming a photoresist mask 1702 on the hard mask layer 1602, performing an etch into the hard mask layer 1602 with the photoresist mask 1702 in place, and subsequently stripping the photoresist mask 1702.

Figure 18:
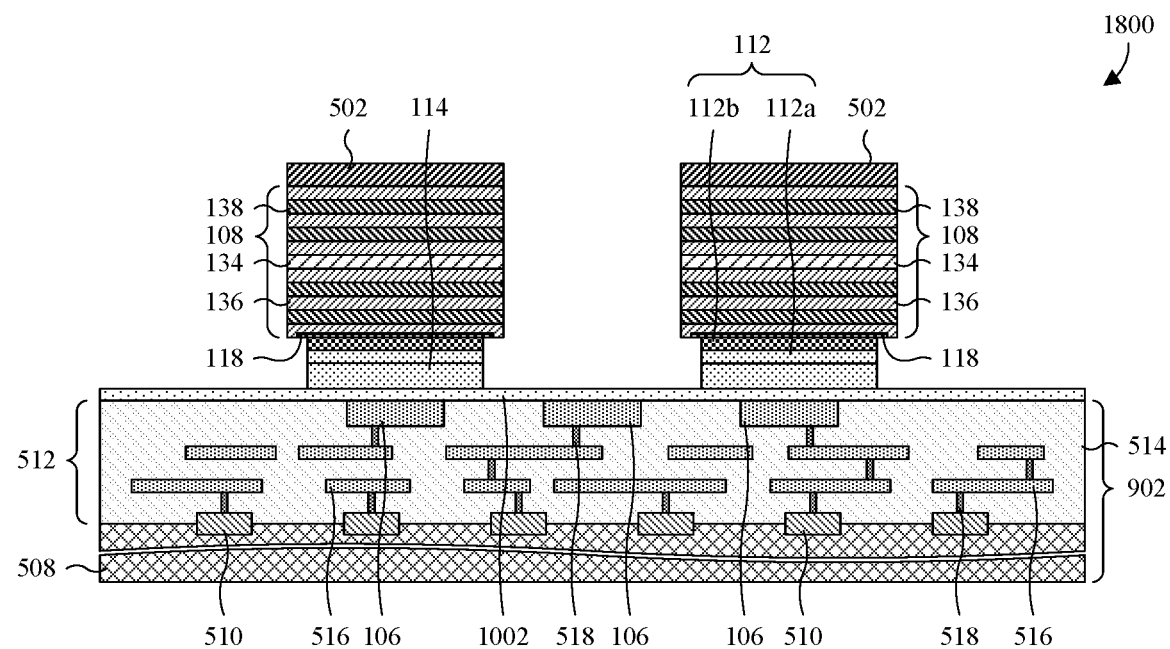

As illustrated by the cross-sectional view 1800 of FIG. 18, an etching process is performed into the epitaxial stack 610 (see FIG. 17) with the hard masks 502 in place to form mesa structures 108 at the mesa areas 702 (see FIG. 17). The etching process may, for example, be performed by a wet etch and/or some other suitable etch(es). As noted above, because the mesa-side bumps 112 may be formed by the metal liftoff process, metal may only diffuse into a portion of the epitaxial stack 610 localized to the mesa-side bumps 112 and the diffusion layers 118 may be formed spaced from side boundaries of the mesa areas 702. Therefore, the etching process may be performed without etching the diffusion layers 118.

In some embodiments, material from the epitaxial stack 610 and material from the mesa-side bumps 112 combine in such a way that the diffusion layers 118 are difficult to etch and/or remove by a wet etchant. Therefore, where the etching process may be performed without etching the diffusion layers 118, the etching process may be performed by wet etching. Otherwise, the etching process may be performed using ion bombardment. However, ion bombardment is messy compared to wet etching due to the transfer of kinetic energy from ions to the etched material. For example, etched material may redeposit on and electrically short the pads 106. As another example, the etched material may redeposit on sidewalls of an etch process chamber, where it may reduce etch rates and/or may lead to contamination of other structures processed in the etch process chamber. Therefore, by forming the mesa-side bump 112 by the metal liftoff process, the above challenges associated with ion bombardment may be avoided.

Figure 19:
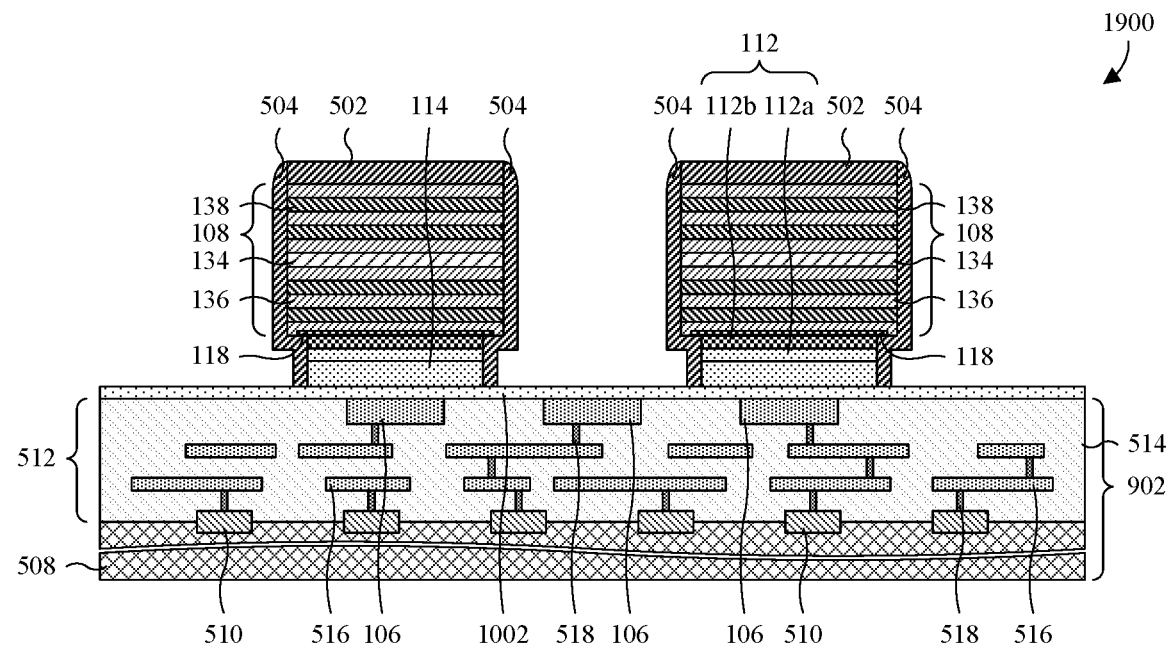

As illustrated by the cross-sectional view 1900 of FIG. 19, sidewall spacers 504 are formed on sidewalls of the mesa structures 108, sidewalls of the mesa-side bumps 112, and sidewalls of the substrate-side bumps 114. The sidewall spacers 504 may be or comprise, for example, silicon oxide, silicon nitride, silicon oxynitride, some other suitable dielectric(s), or any combination of the foregoing. In some embodiments, a process for forming the sidewall spacers 504 comprises depositing a sidewall spacer layer and subsequently performing an etch back into the sidewall spacer layer. The depositing may, for example, be performed by CVD, PVD, some other suitable deposition process(es), or any combination of the foregoing.

Figure 20:
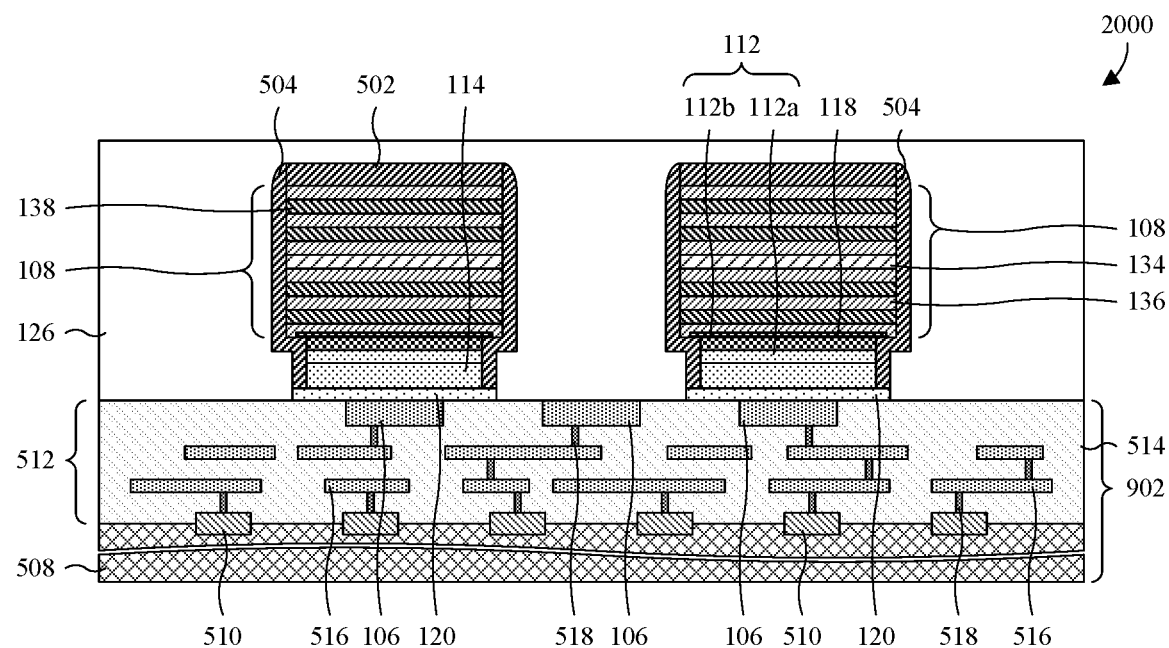

As illustrated by the cross-sectional view 2000 of FIG. 20, an etching process is performed into the first contact layer 1002 (see FIG. 19) to form backside contacts 120 respectively under the substrate-side bumps 114. The etching process comprises applying an etchant to the first contact layer 1002 and uses the sidewall spacers 504 and the hard masks 502 as a mask to form the backside contacts 120. The sidewall spacers 504 and the hard masks 502 also protect the mesa structures 108 during the etching process. The etching process may, for example, be performed by a wet etch, a dry etch, some other suitable etch, or any combination of the foregoing.

Also illustrated by the cross-sectional view 2000 of FIG. 20, a dielectric structure 126 is formed surrounding the mesa structures 108. The dielectric structure 126 may be or comprise, for example, a molding compound, some other suitable dielectric material(s), or any combination of the foregoing. In some embodiments, a process for forming the dielectric structure 126 comprises depositing the dielectric structure 126 by CVD, PVD, sputtering, some other deposition process(es), or any combination of the foregoing. In some embodiments, the process further comprises a chemical mechanical polish (CMP) or some other suitable planarization process into an upper or top surface of the dielectric structure 126.

Figure 21:
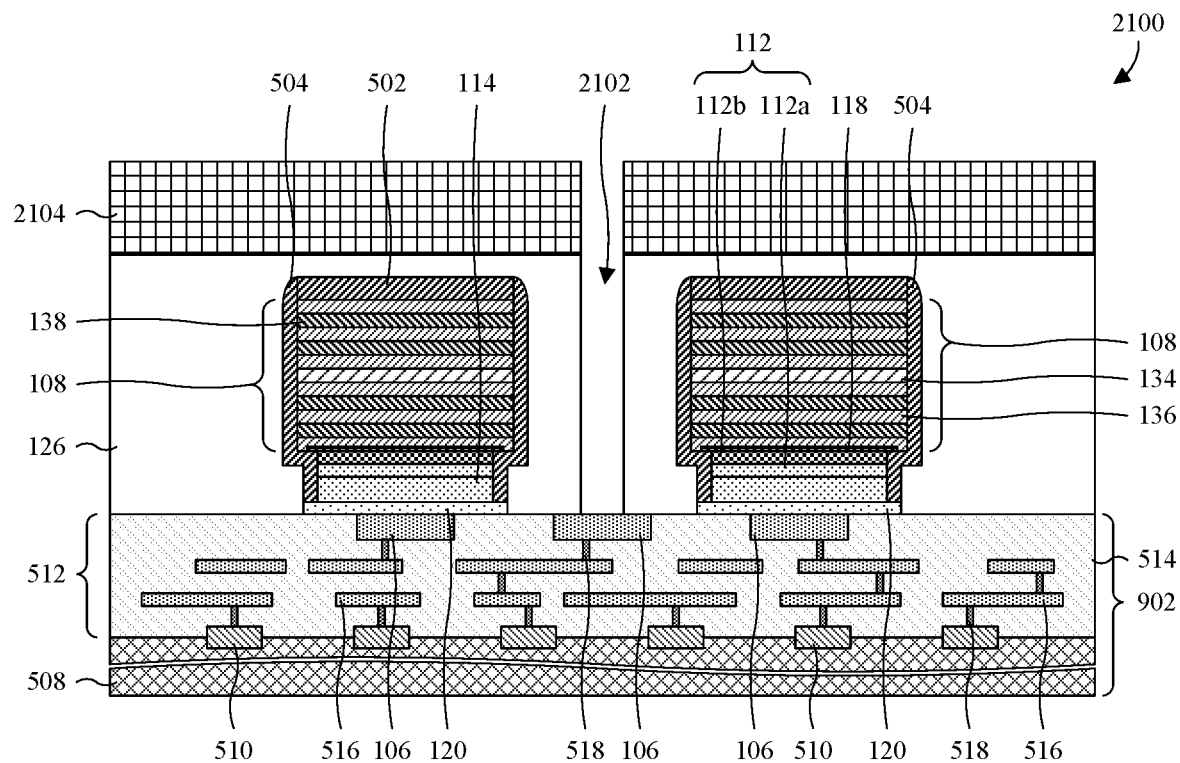

As illustrated by the cross-sectional view 2100 of FIG. 21, the dielectric structure 126 is patterned to form a via opening 2102 that is between neighboring mesa structures 108 and that exposes one of the pads 106. The patterning may, for example, be performed by a photolithography/etching process and/or some other suitable patterning process(es). The photolithography/etching process may, for example, comprise forming a photoresist mask 2104 on the dielectric structure 126, performing an etch into the dielectric structure 126 with the photoresist mask 2104 in place, and subsequently stripping the photoresist mask 2104.

Figure 22:
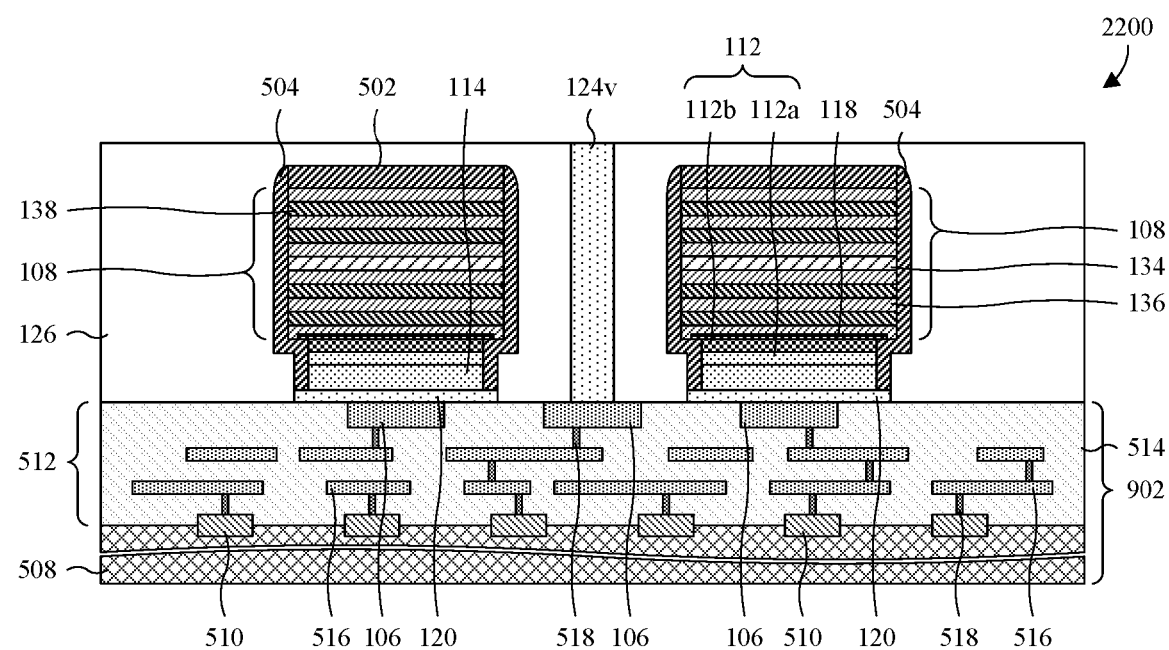

As illustrated by the cross-sectional view 2200 of FIG. 22, a via 124v is formed in the via opening 2102. The via 124v may be or comprise, for example, titanium, tungsten, copper, aluminum copper, some other suitable conductive material(s), or any combination of the foregoing. In some embodiments, the via 124v is formed by a plating process that uses a corresponding one of the pads 106 as a seed. The plating process may, for example, be electroplating, electroless plating, some other suitable plating process(es), or any combination of the foregoing. In other embodiments, the via 124v is formed by depositing a metal layer covering the dielectric structure 126 and filling the via opening 2102, and subsequently performing a planarization into the metal layer until an upper or top surface of the metal layer is about even with that of the dielectric structure 126. Notwithstanding the two above processes for forming the via 124v, other processes are amenable in other embodiments.

Figure 23:
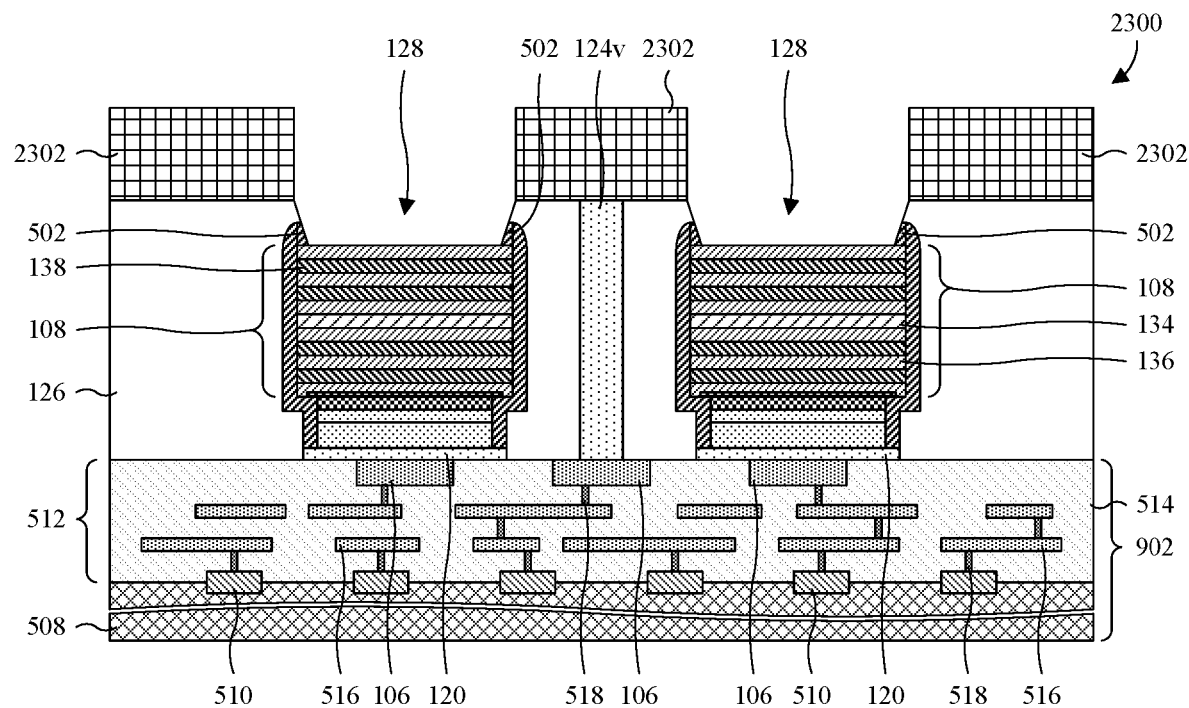

As illustrated by the cross-sectional view 2300 of FIG. 23, the dielectric structure 126 and the hard masks 502 are patterned to form contact openings 128 exposing the mesa structures 108. The patterning may, for example, be performed by a photolithography/etching process and/or some other suitable patterning process(es). The photolithography/etching process may, for example, comprise forming a photoresist mask 2302 on the dielectric structure 126, performing an etch into the dielectric structure 126 and the hard masks 502 with the photoresist mask 2302 in place, and subsequently stripping the photoresist mask 2302.

Figure 24:
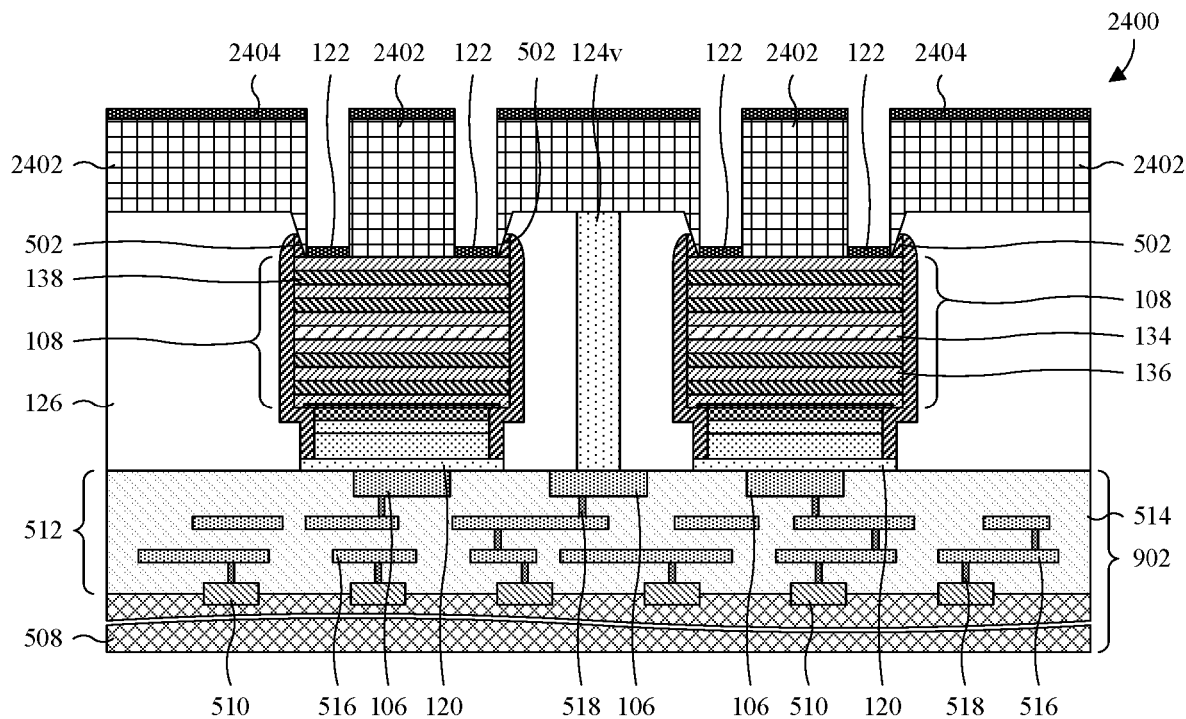

As illustrated by the cross-sectional view 2400 of FIG. 24, frontside contacts 122 are formed in the contact openings 128 (see FIG. 23), on the mesa structures 108. In some embodiments, top layouts of the frontside contacts 122 are square-ring shaped, circular-ring shaped, or some other suitable shape. The frontside contacts 122 may be or comprise, for example, titanium, tungsten, copper, some other suitable conductive material(s), or any combination of the foregoing.

In some embodiments, the frontside contacts 122 are formed by a metal liftoff process. Other approaches to forming the frontside contacts 122 are, however, amenable in other embodiments. In some embodiments, the metal liftoff process comprises: forming a photoresist mask 2402 with openings corresponding to the frontside contacts 122; depositing a second contact layer 2404 on the photoresist mask 2402 and in the openings while the photoresist mask 2402 is in place; and removing the photoresist mask 2402. By removing the photoresist mask 2402, portions of the second contact layer 2404 on the photoresist mask 2402 are lifted off while portions of the second contact layer 2404 in the openings remain to define the frontside contacts 122. The depositing may, for example, be performed by sputtering, EBPVD, some other suitable deposition process(es), or any combination of the foregoing.

Figure 25:
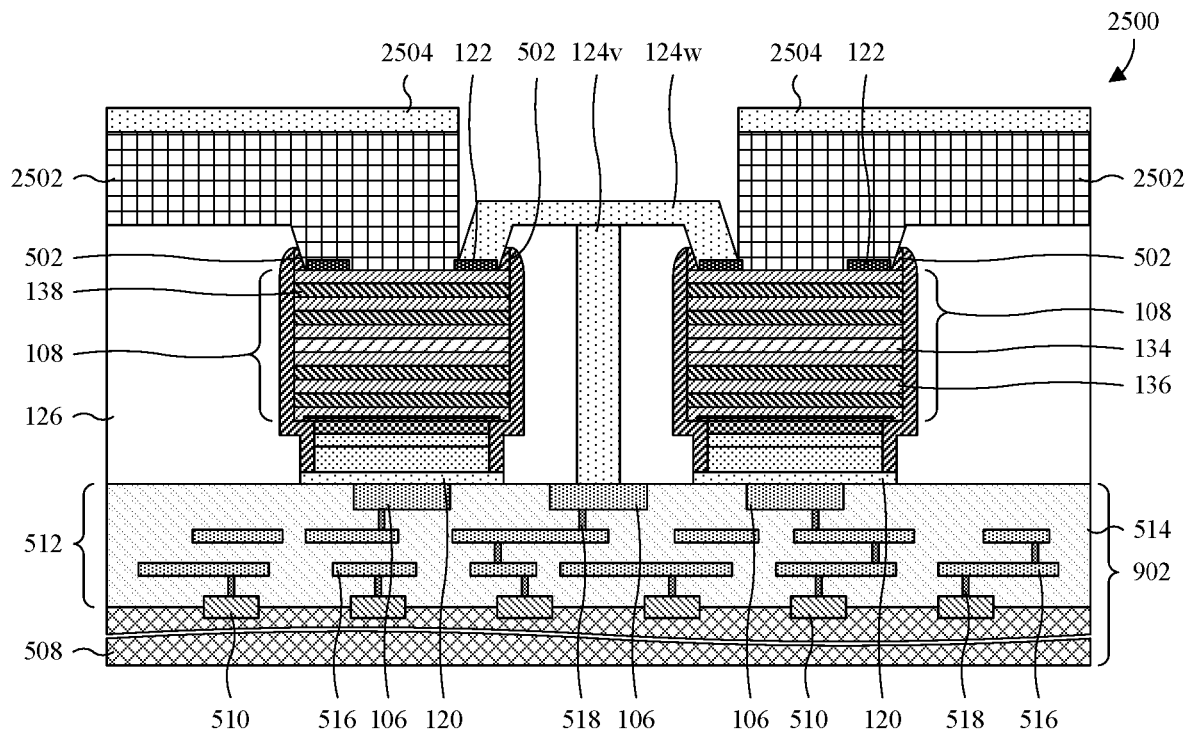

As illustrated by the cross-sectional view 2500 of FIG. 25, a wire 124w is formed electrically coupling the via 124v to the frontside contacts 122. The wire 124w may be or comprise, for example, titanium, tungsten, copper, aluminum copper, some other suitable conductive material(s), or any combination of the foregoing.

In some embodiments, the wire 124w is formed by a metal liftoff process. Other approaches to forming the wire 124w are, however, amenable in other embodiments. In some embodiments, the metal liftoff process comprises: forming a photoresist mask 2502 with an opening corresponding to the wire 124w; depositing a conductive layer 2504 on the photoresist mask 2502 and in the opening while the photoresist mask 2502 is in place; and removing the photoresist mask 2502. By removing the photoresist mask 2502, portions of the conductive layer 2504 on the photoresist mask 2502 are lifted off while portions of the conductive layer 2504 in the opening remain to define the wire 124w. The depositing may, for example, be performed by sputtering, EBPVD, some other suitable deposition process(es), or any combination of the foregoing.

In some embodiments, after forming the wire 124w, the die regions 904 (see FIG. 11A) of the second workpiece 902 are separated into IC chips. The separation may, for example, be performed by a die saw or some other suitable tool.

Figure 26:
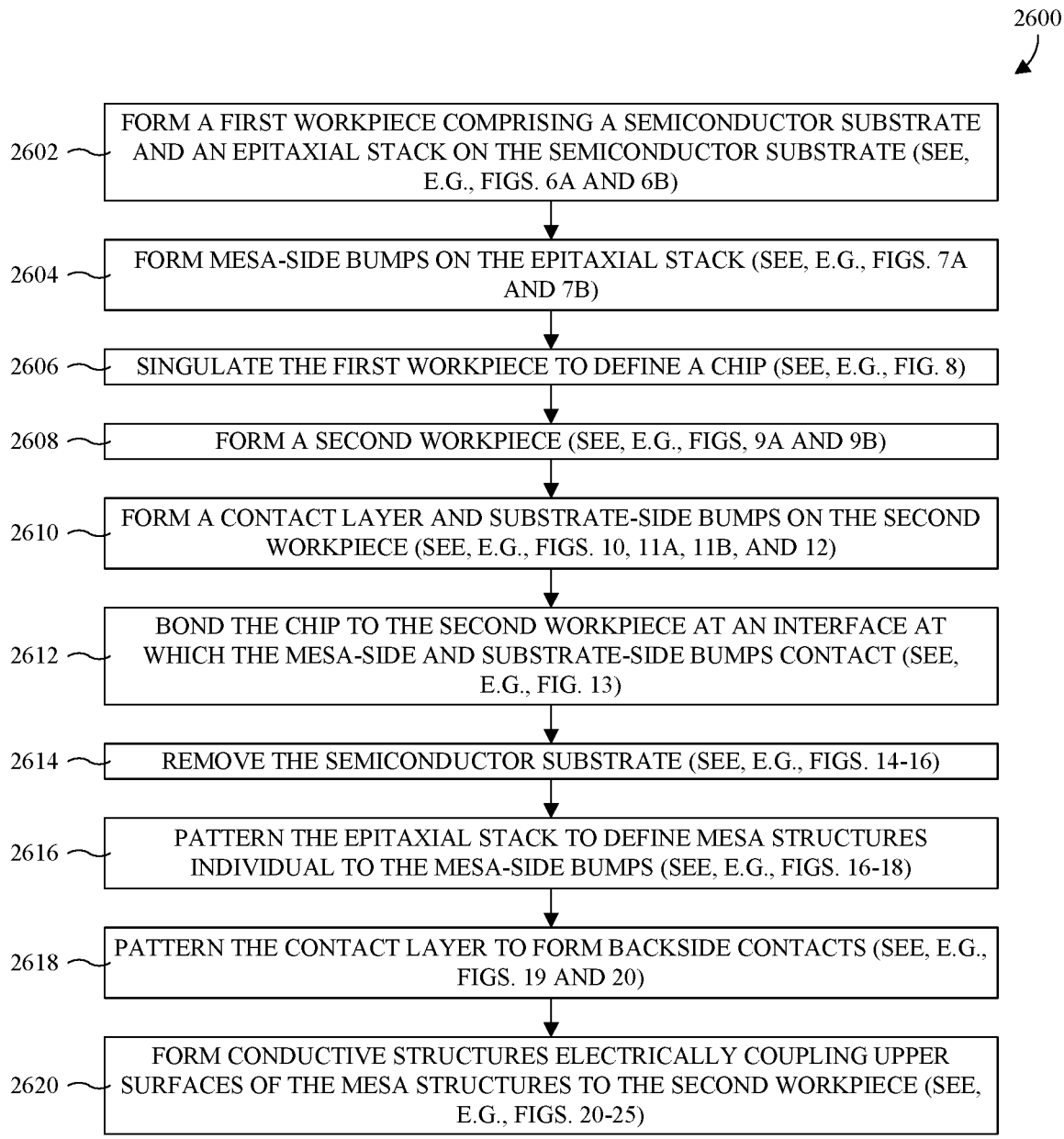
FIG. 26 illustrates a block diagram of some embodiments of the method of FIGS. 6A, 6B, 7A, 7B, 8, 9A, 9B, 10, 11A, 11B, and 12-25.

With reference to FIG. 26, a block diagram 2600 of some embodiments of the method of FIGS. 6A, 6B, 7A, 7B, 8, 9A, 9B, 10, 11A, 11B, and 12-25 is provided.

At 2602, a first workpiece comprising a semiconductor substrate and an epitaxial stack on the semiconductor substrate is formed. See, for example, FIGS. 6A and 6B.

At 2604, mesa-side bumps are formed on the epitaxial stack. See, for example, FIGS. 7A and 7B.

At 2606, the first workpiece is singulated to define a chip. See, for example, FIG. 8.

At 2608, a second workpiece is formed. See, for example, FIGS. 9A and 9B.

At 2610, a contact layer and substrate-side bumps are formed on the second workpiece. See, for example, FIGS. 10, 11A, 11B, and 12.

At 2612, the chip is bonded to the second workpiece at an interface at which the mesa-side and substrate-side bumps contact. See, for example, FIG. 13.

At 2614, the semiconductor substrate is removed. See, for example, FIGS. 14-16.

At 2616, the epitaxial stack is patterned to define mesa structures individual to the mesa-side bumps. See, for example, FIGS. 16-18.

At 2618, the contact layer is patterned to form backside contacts. See, for example, FIGS. 19 and 20.

At 2620, conductive structures are formed electrically coupling upper surfaces of the mesa structures to the second workpiece. See, for example, FIGS. 20-25.

While the block diagram 2600 of FIG. 26 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 27-34, a series of cross-sectional views 2700-3400 illustrates some embodiments of a method for forming an integrated chip comprising multiple group III-V devices bonded to a substrate and having an etch stop layer. In other embodiments, the method may form and/or use devices based on semiconductor materials other than group III-V materials in place of the group III-V devices. The integrated chip may, for example, be as illustrated and described with regard to FIG. 5B. While FIGS. 27-34 are described with reference to a method, it will be appreciated that the structures shown in FIGS. 27-34 are not limited to the method and may stand alone.

Figure 27:
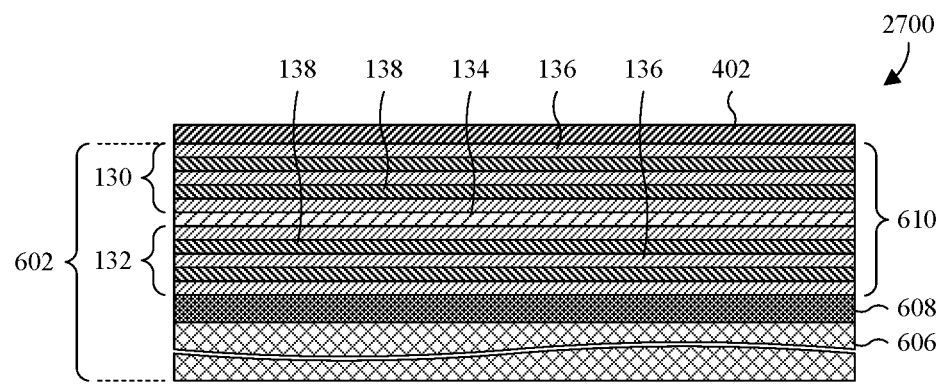
FIGS. 27-34 illustrate a series of cross-sectional views of some embodiments of a method for forming an integrated chip comprising multiple group III-V devices bonded to a substrate and having an etch stop layer.

As illustrated by the cross-sectional view 2700 of FIG. 27, a first workpiece 602 is formed. The first workpiece 602 may, for example, be as illustrated and described with regard to FIGS. 6A and 6B. Further, a second etch stop layer 402 is formed on the first workpiece 602. The second etch stop layer 402 may be or comprise, for example, silicon nitride, silicon oxide, silicon oxynitride, some other suitable dielectric(s), some other suitable etch stop material(s), or any combination of the foregoing. In some embodiments, the second etch stop layer 402 is formed by CVD, PVD, sputtering, some other suitable deposition process(es), or any combination of the foregoing.

Figure 28:
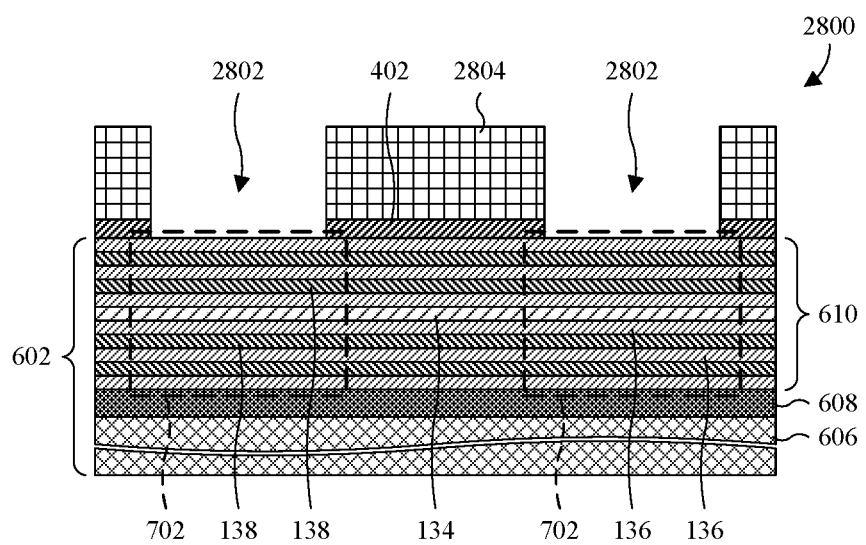

As illustrated by the cross-sectional view 2800 of FIG. 28, the second etch stop layer 402 is patterned to form mesa openings 2802 exposing mesa areas 702 of the epitaxial stack 610. The patterning may, for example, be performed by a photolithography/etching process and/or some other suitable patterning process(es). The photolithography/etching process may, for example, comprise forming a photoresist mask 2804 on the second etch stop layer 402, performing an etch into the second etch stop layer 402 with the photoresist mask 2804 in place, and subsequently stripping the photoresist mask 2804.

Figure 29:
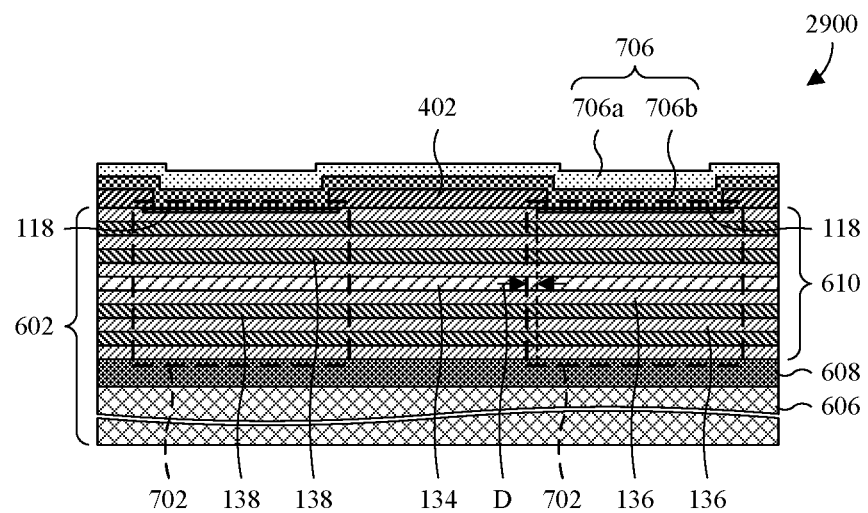

As illustrated by the cross-sectional view 2900 of FIG. 29, a mesa-side bump layer 706 is formed covering the second etch stop layer 402 and lining the mesa openings 2802 (see FIG. 28). The mesa-side bump layer 706 may be or comprise, for example, gold, nickel, titanium, some other suitable metal(s), some other suitable conductive material(s), or any combination of the foregoing. In some embodiments, the mesa-side bump layer 706 comprises a first mesa-side bump layer 706a and a second mesa-side bump layer 706b. The mesa-side bump layer 706 may, for example, be performed by CVD, PVD, electroplating, electroless plating, some other suitable deposition and/or plating process(es), or any combination of the foregoing.

In some embodiments, upon forming the mesa-side bump layer 706, material of the mesa-side bump layer 706 diffuses into the epitaxial stack 610 and defines diffusion layers 118 individual to the mesa areas 702. Therefore, the diffusion layers 118 comprise material from both the epitaxial stack 610 and the mesa-side bumps 112. In some embodiments, material from the epitaxial stack 610 and material from the mesa-side bump layer 706 combines in such a way that the diffusion layers 118 are difficult to etch and/or remove by a wet etchant. By forming the mesa-side bump layer 706 over the second etch stop layer 402, the second etch stop layer 402 spaces the mesa-side bump layer 706 from portions of the epitaxial stack 610 to sides of the mesa areas 702. As a result, the second etch stop layer 402 causes the diffusion layers 118 to form spaced from side boundaries of the mesa areas 702 by a distance D.

Figure 30:
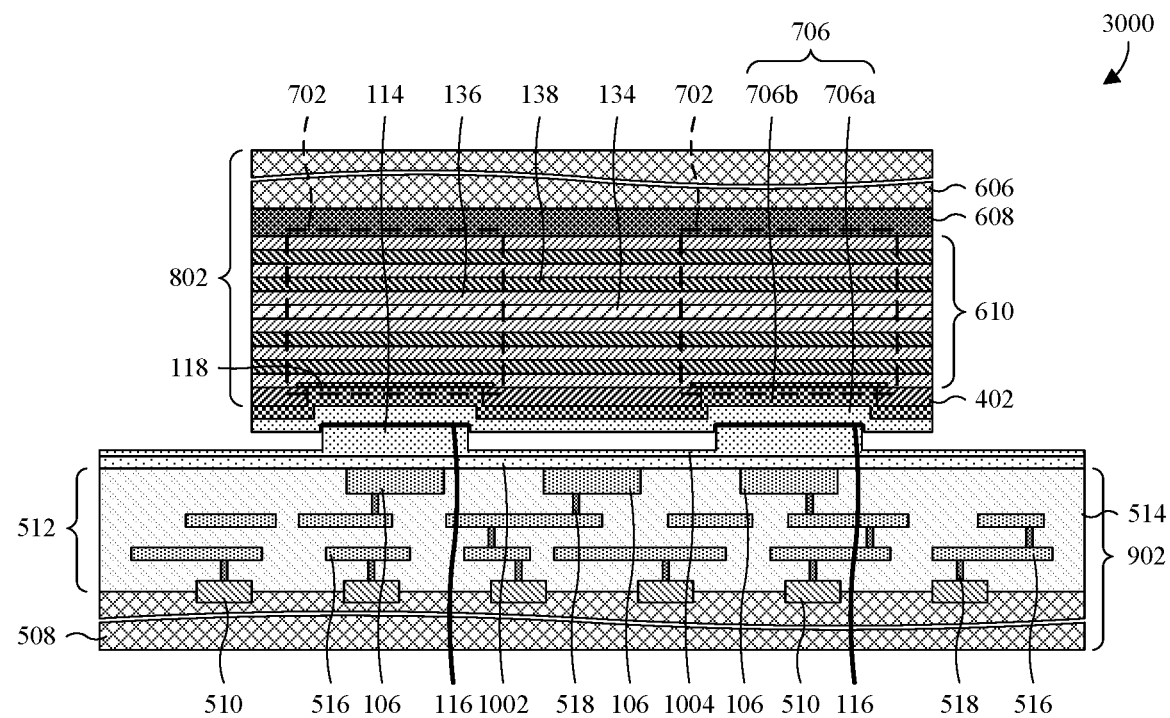

As illustrated by the cross-sectional view 3000 of FIG. 30, the acts at FIGS. 8, 9A, 9B, 10, 11A, 11B, and 13, but not the acts at FIG. 12, are performed as illustrated and described above. While performing the acts at FIG. 8, the first workpiece 602 (see FIG. 29) is divided into chips 802. While performing the acts at FIGS. 9A and 9B, a second workpiece 902 is formed. While performing the acts of FIG. 10, a first contact layer 1002 and a seed layer 1004 are formed on the second workpiece 902. While performing the acts at FIGS. 11A and 11B, substrate-side bumps 114 are formed on the second workpiece 902, at corresponding pads 106 of the second workpiece 902. While performing the acts at FIG. 13, one of the chips 802 is flipped vertically and is bonded to the second workpiece 902 at a bond interface 116 at which the substrate-side bumps 114 and the mesa-side bump layer 706 contact.

Figure 31:
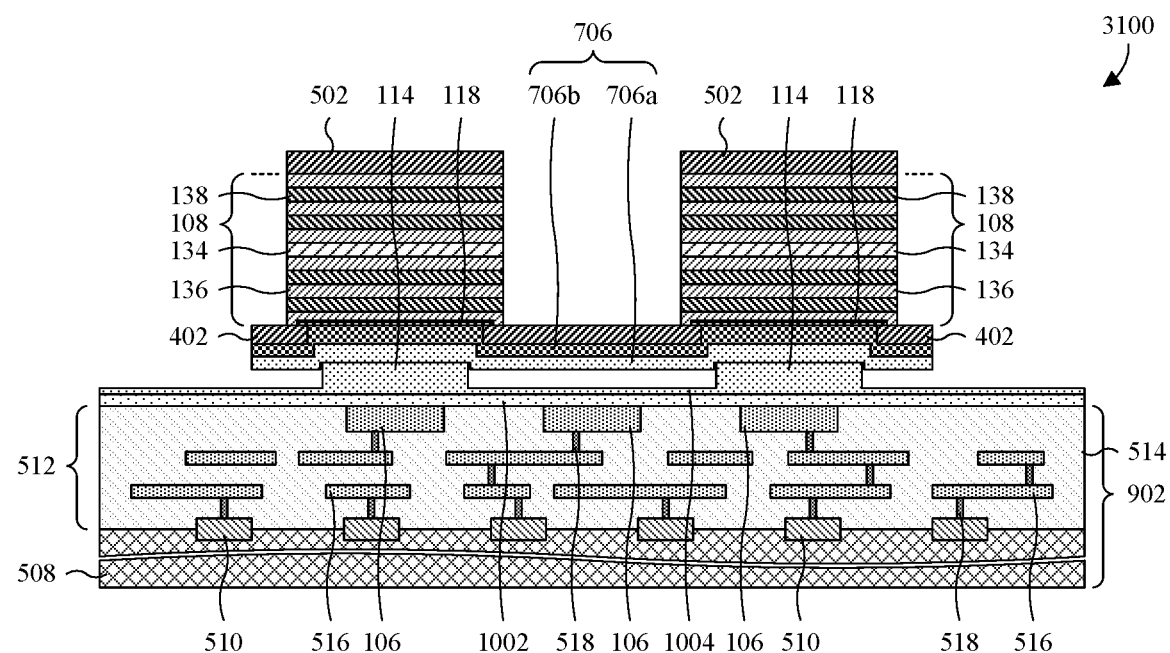

As illustrated by the cross-sectional view 3100 of FIG. 31, the acts at FIGS. 14-18 are performed as illustrated and described above. The acts at FIGS. 14 and 15 are employed to remove the first etch stop layer 608 and the first semiconductor substrate 606. The acts at FIGS. 16-18 are employed to pattern the epitaxial stack 610 (see FIG. 30) so as to define mesa structures 108 at the mesa areas 702 (see FIG. 30). The patterning comprises forming hard masks 502 on the epitaxial stack 610, and subsequently performing an etch into the epitaxial stack 610 with the hard masks 502 in place. During the etch, the second etch stop layer 402 is used as an etch stop. The etch may, for example, be performed by a wet or chemical etching process and/or may, for example, be performed by some other suitable etching process.

In some embodiments, material from the epitaxial stack 610 and material from the mesa-side bumps 112 combines in such a way that the diffusion layers 118 are difficult to etch and/or remove by a wet etchant. Where the etch may be performed without etching through the diffusion layers 118, the etch may be performed by wet etching. Otherwise, the etch may, for example, be performed using ion bombardment. However, ion bombardment is messy compared to wet etching due to the transfer of kinetic energy from ions to the etched material. For example, etched material may redeposit on and electrically short the pads 106 and/or the substrate-side bumps 114. As another example, the etched material may redeposit on sidewalls of an etch process chamber, where it may reduce etch rates and/or may lead to contamination of other structures. Since the second etch stop layer 402 causes the diffusion layers 118 to form localized to the mesa areas 702 (see FIG. 30) and hence the mesa structures 108, the etch may be performed without etching through the diffusion layers 118 and the above challenges associated with ion bombardment may be avoided.

Figure 32:
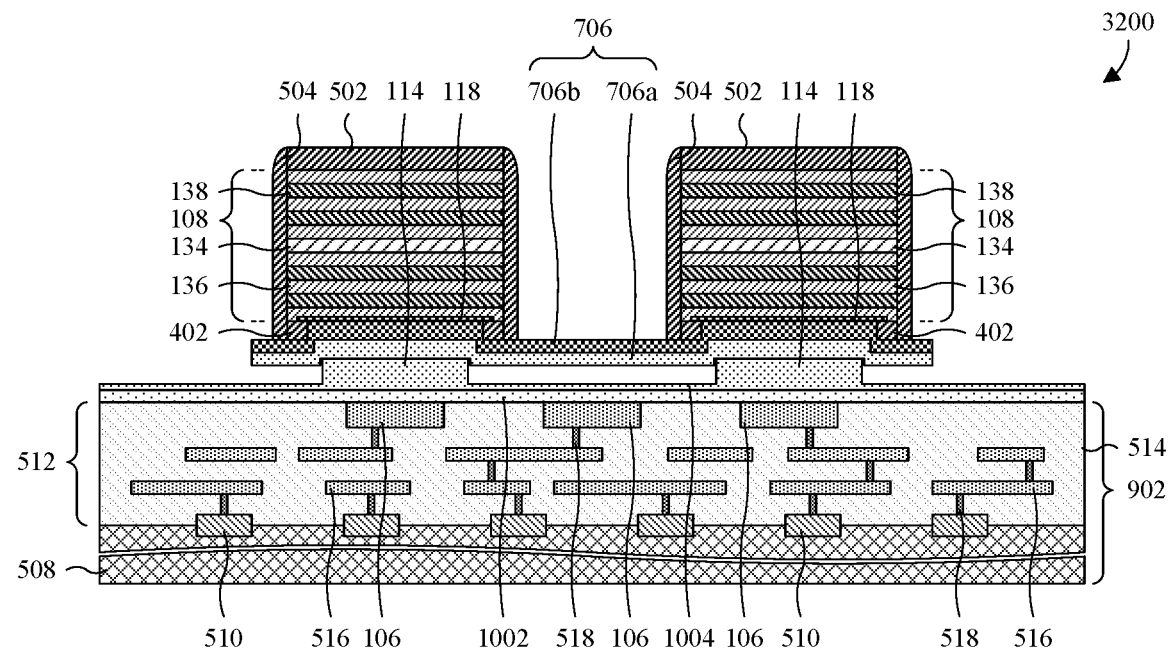

As illustrated by the cross-sectional view 3200 of FIG. 32, the second etch stop layer 402 is patterned according to a layout of the hard masks 502. The patterning may, for example, be performed by an etching process and/or some other suitable patterning process. The etching process may, for example, comprise applying a wet etchant, a dry etchant, some other suitable etchant(s), or any combination of the foregoing to the second etch stop layer 402.

Also illustrated by the cross-sectional view 3200 of FIG. 32, sidewall spacers 504 are formed on sidewalls of the mesa structures 108 and sidewalls of the second etch stop layer 402. In some embodiments, a process for forming the sidewall spacers 504 comprises depositing a sidewall spacer layer and subsequently performing an etch back into the sidewall spacer layer. The depositing may, for example, be performed by CVD, PVD, some other suitable deposition process(es), or any combination of the foregoing.

Figure 33:
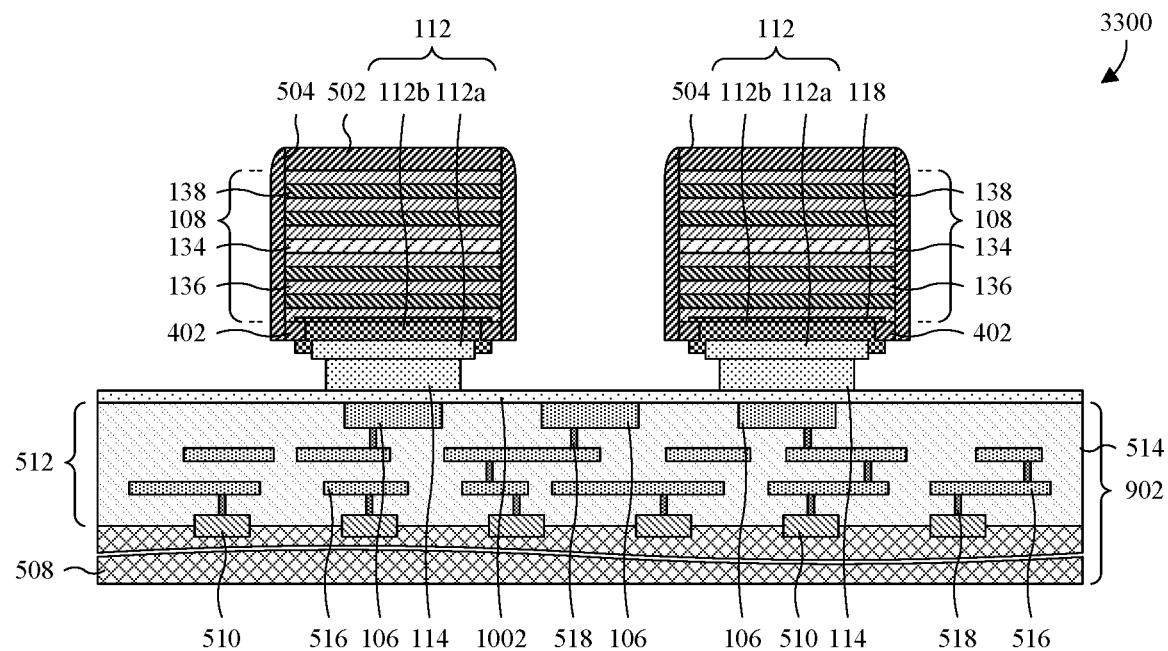

As illustrated by the cross-sectional view 3300 of FIG. 33, the mesa-side bump layer 706 (see FIG. 32) is patterned to form mesa-side bumps 112 individual to the mesa structures 108. In some embodiments, the mesa-side bumps 112 comprise individual first bump segments 112a formed from the first mesa-side bump layer 706a, and further comprise individual second bump segments 112b underlying the first bump segments 112a and formed from the second mesa-side bump layer 706b. Additionally, the seed layer 1004 (see FIG. 32) is removed. The patterning of the mesa-side bump layer 706 and the removal of the seed layer 1004 may, for example, be performed by an etching process in which the hard masks 502 and the sidewall spacers 504 protect the mesa structures 108 and serve as a mask. Other processes for performing the patterning are, however, amenable in other embodiments. The etching process may, for example, be a wet etching process, a dry etching process, or some other suitable etching process. In some embodiments, the substrate-side bumps 114 are reduced in size during the etching process. Further, in some embodiments, the first bump segments 112a are etched more than the second bump segments 112b during the etching process, such that the first bump segments 112a have a reduced width relative to the second bump segments 112b.

Figure 34:
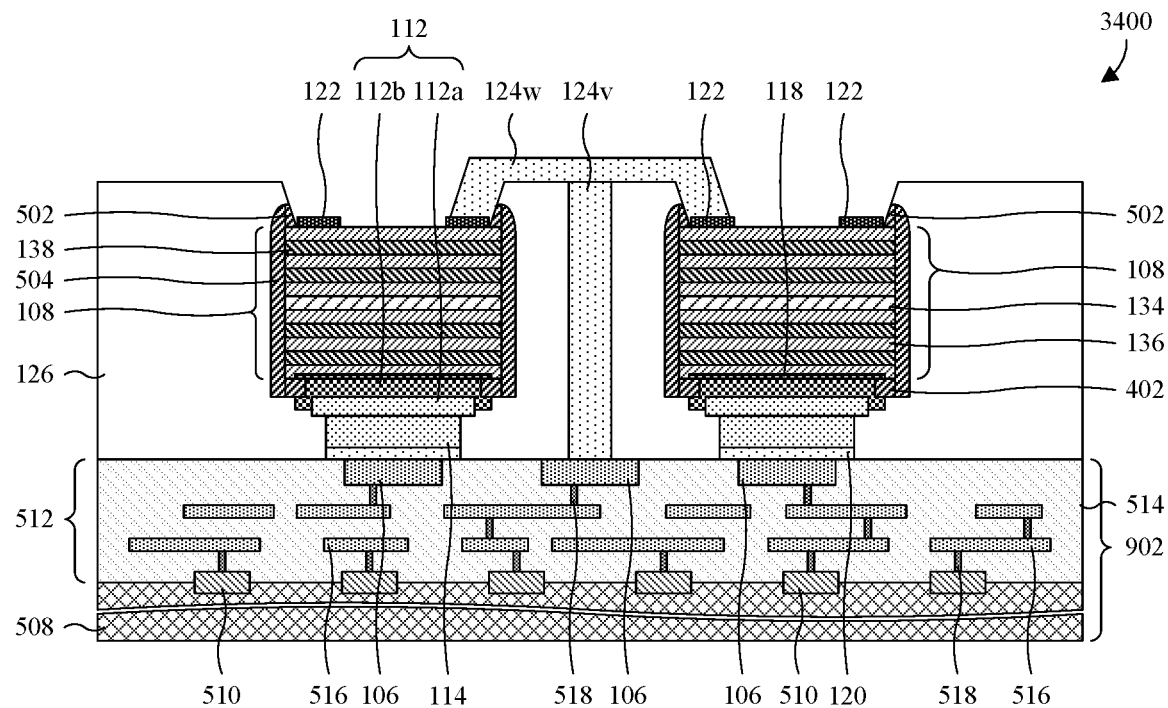

As illustrated by the cross-sectional view 3400 of FIG. 34, the acts at FIGS. 20-25 are performed as illustrated and described above. While performing the acts at FIG. 20, the first contact layer 1002 (see FIG. 33) is patterned to form backside contacts 120. Further, a dielectric structure 126 is formed surrounding the mesa structures 108. While performing the acts at FIG. 21, the dielectric structure 126 is patterned to form a via opening that is between neighboring mesa structures 108 and that exposes one of the pads 106. While performing the acts at FIG. 22, a via 124v is formed in the via opening. While performing the acts at FIG. 23, the dielectric structure 126 and the hard masks 502 are patterned to form contact openings exposing the mesa structures 108. While performing the acts at FIG. 24, frontside contacts 122 are formed in the contact openings, on the mesa structures 108. While performing the acts at FIG. 25, a wire 124w is formed electrically coupling the via 124v to the frontside contacts 122.

Figure 35:
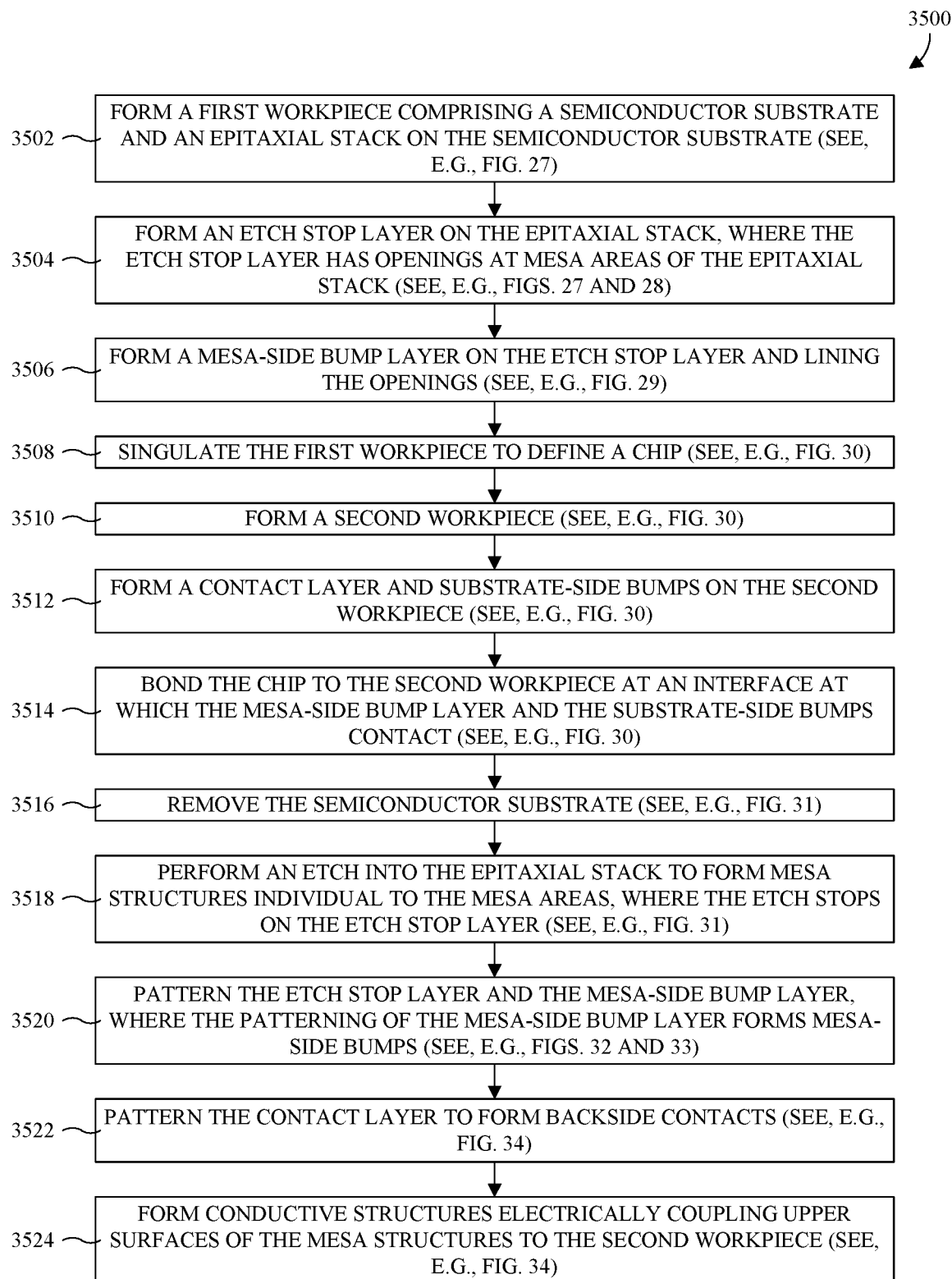
FIG. 35 illustrates a block diagram of some embodiments of the method of FIGS. 27-34.

With reference to FIG. 35, a block diagram 3500 of some embodiments of the method of FIGS. 27-34 is provided.

At 3502, a first workpiece comprising a semiconductor substrate and an epitaxial stack on the semiconductor substrate is formed. See, for example, FIG. 27.

At 3504, an etch stop layer is formed on the epitaxial stack, where the etch stop layer has openings at mesa areas of the epitaxial stack. See, for example, FIGS. 27 and 28.

At 3506, a mesa-side bump layer is formed on the etch stop layer and lining the openings. See, for example, FIG. 29.

At 3508, the first workpiece is singulated to define a chip. See, for example, FIG. 30.

At 3510, a second workpiece is formed. See, for example, FIG. 30.

At 3512, a contact layer and substrate-side bumps are formed on the second workpiece. See, for example, FIG. 30.

At 3514, the chip is bonded to the second workpiece at an interface at which the mesa-side bump layer and the substrate-side bumps contact. See, for example, FIG. 30.

At 3516, the semiconductor substrate is removed. See, for example, FIG. 31.

At 3518, an etch is performed into the epitaxial stack to form mesa structures individual to the mesa areas, where the etch stops on the etch stop layer. See, for example, FIG. 31.

At 3520, the etch stop layer and the mesa-side bump layer are patterned, where the patterning of the mesa-side bump layer forms mesa-side bumps. See, for example, FIGS. 32 and 33.

At 3522, the contact layer is patterned to form backside contacts. See, for example, FIG. 34.

At 3524, conductive structures are formed electrically coupling upper surfaces of the mesa structures to the second workpiece. See, for example, FIG. 35.

While the block diagram 3500 of FIG. 35 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 36-40, a series of cross-sectional views 3600-4000 illustrates some embodiments of a method for forming an integrated chip comprising multiple group III-V devices bonded to a substrate with pre-patterned mesa-side bumps and having an etch stop layer. In other embodiments, the method may form and/or use devices based on semiconductor materials other than group III-V materials in place of the group III-V devices. The integrated chip may, for example, be as illustrated and described with regard to FIG. 5C. While FIGS. 36-40 are described with reference to a method, it will be appreciated that the structures shown in FIGS. 36-40 are not limited to the method and may stand alone.

Figure 36:
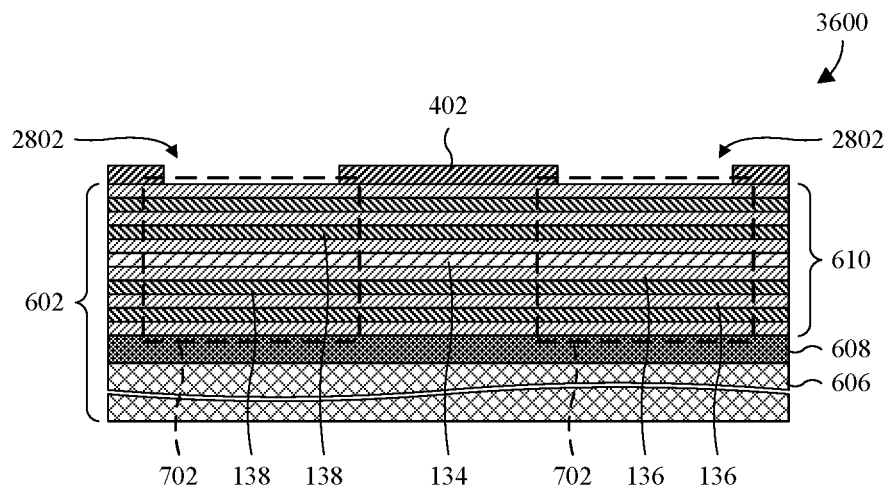
FIGS. 36-40 illustrate a series of cross-sectional views of some embodiments of a method for forming an integrated chip comprising multiple group III-V devices bonded to a substrate with pre-patterned mesa-side bumps and having an etch stop layer.

As illustrated by the cross-sectional view 3600 of FIG. 36, a first workpiece 602 is formed. The first workpiece 602 may, for example, be as illustrated and described with regard to FIGS. 6A and 6B. Further, a second etch stop layer 402 is formed and patterned on the first workpiece 602 according to the acts illustrated and described with regard to FIGS. 27 and 28. While performing the acts at FIG. 27, the second etch stop layer 402 is formed on the first workpiece 602. While performing the acts at FIG. 28, the etch stop layer is patterned to form mesa openings 2802 exposing mesa areas 702 of the epitaxial stack 610.

Figure 37:
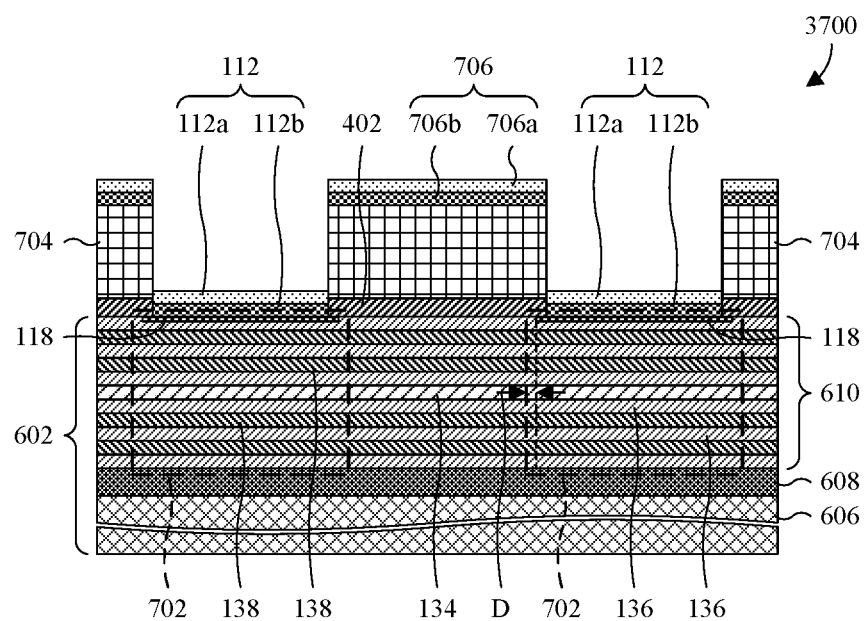

As illustrated by the cross-sectional view 3700 of FIG. 37, mesa-side bumps 112 are formed on the first workpiece 602, within the mesa openings 2802 (see FIG. 36). In some embodiments, the mesa-side bumps 112 comprise individual first bump segments 112a and individual second bump segments 112b underlying the first bump segments 112a. In some embodiments, upon forming the mesa-side bumps 112, material of the mesa-side bumps 112 diffuses into the epitaxial stack 610 and defines diffusion layers 118 individual to the mesa-side bumps 112. In some embodiments, the material from both the epitaxial stack 610 and the material from the mesa-side bumps 112 combine in such a way that the diffusion layers 118 are difficult to etch and/or remove by a wet etchant.

The mesa-side bumps 112 are formed by a metal liftoff process in some embodiments. Other approaches to forming the mesa-side bumps 112 are, however, amenable in other embodiments. In some embodiments, the metal liftoff process comprises: forming a photoresist mask 704 on the epitaxial stack 610 and with openings at the mesa areas 702; depositing a mesa-side bump layer 706 on the photoresist mask 704 and in the openings while the photoresist mask 704 is in place; and removing the photoresist mask 704. In some embodiments, the mesa-side bump layer 706 comprises a first mesa-side bump layer 706a and a second mesa-side bump layer 706b respectively corresponding to the first bump segments 112a and the second bump segments 112b. By removing the photoresist mask 704, portions of the mesa-side bump layer 706 on the photoresist mask 704 are lifted off while portions of the mesa-side bump layer 706 in the openings remain to define the mesa-side bumps 112. By forming the mesa-side bump layer 706 over the second etch stop layer 402, the second etch stop layer 402 spaces the mesa-side bump layer 706 from portions of the epitaxial stack 610 to sides of the mesa areas 702. As a result, the second etch stop layer 402 causes the diffusion layer s118 to form spaced from side boundaries of the mesa areas 702 by a distance D.

Figure 38:
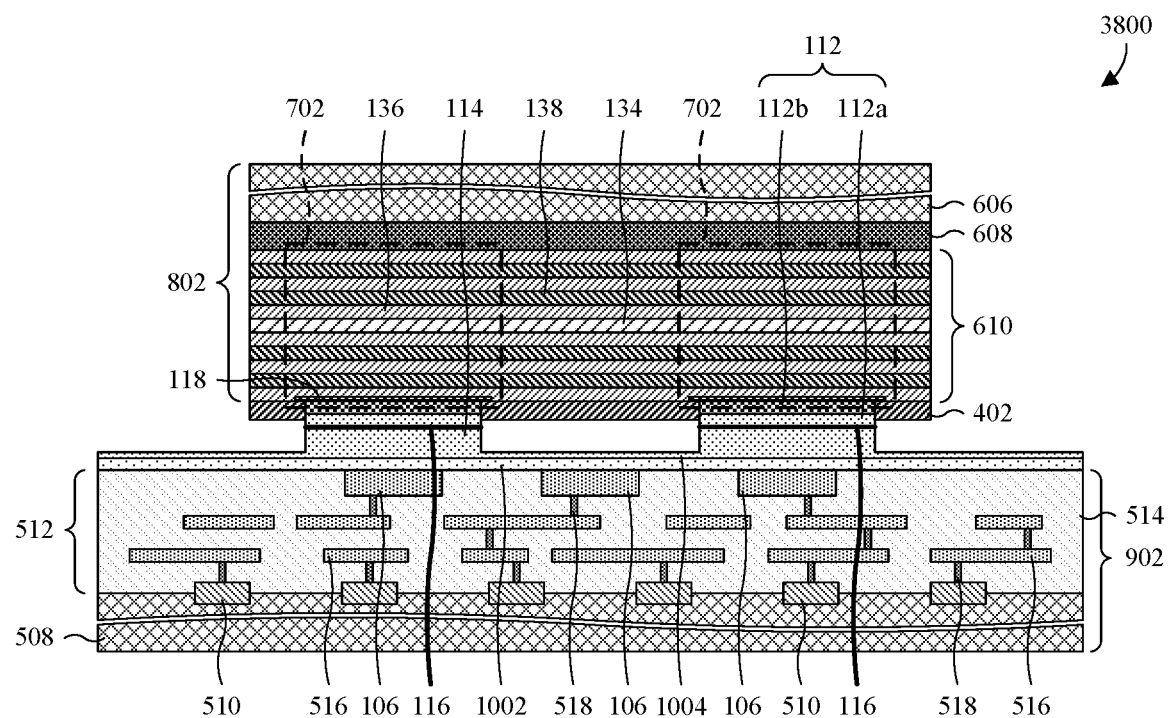

As illustrated by the cross-sectional view 3800 of FIG. 38, the acts at FIGS. 8, 9A, 9B, 10, 11A, 11B, and 13, but not the acts at FIG. 12, are performed as illustrated and described above. While performing the acts at FIG. 8, the first workpiece 602 (see FIG. 37) is divided into chips 802. While performing the acts at FIGS. 9A and 9B, a second workpiece 902 is formed. While performing the acts at FIG. 10, a first contact layer 1002 and a seed layer 1004 are formed on the second workpiece 902. While performing the acts at FIGS. 11A and 11B, substrate-side bumps 114 are formed on the second workpiece 902, at corresponding pads 106 of the second workpiece 902. While performing the acts at FIG. 13, one of the chips 802 is flipped vertically and bonded to the second workpiece 902 at a bond interface 116 at which the substrate-side bumps 114 and the mesa-side bumps 112 contact.

Figure 39:
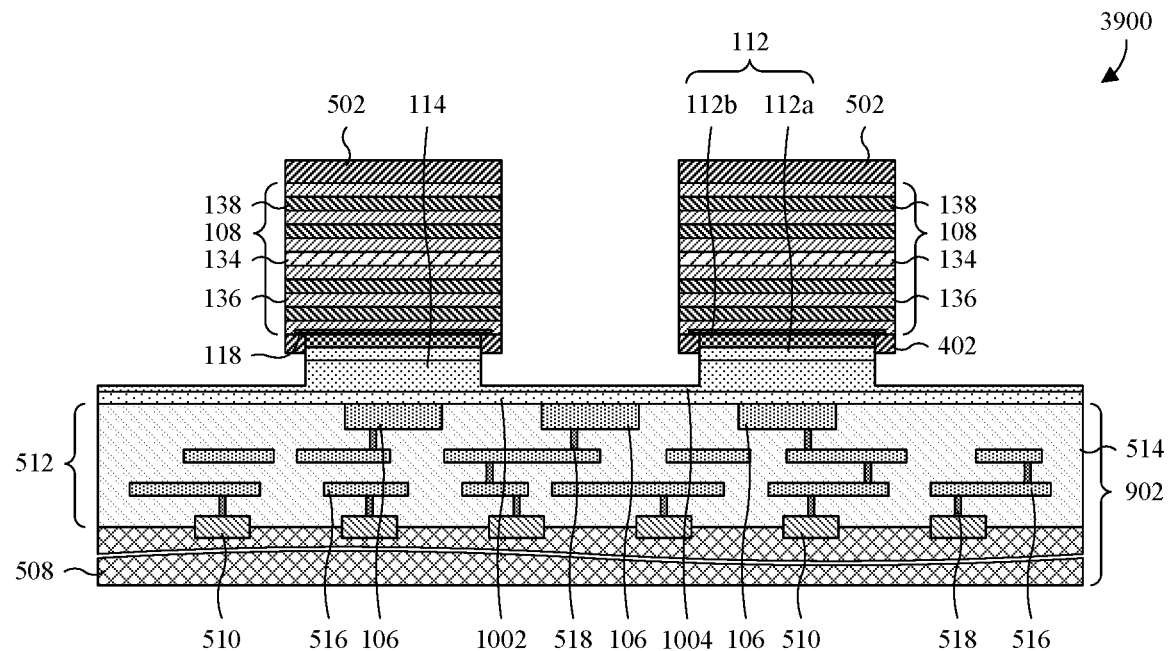

As illustrated by the cross-sectional view 3900 of FIG. 39, the acts at FIGS. 14-18 are performed as illustrated and described above. The acts at FIGS. 14 and 15 are employed to remove the first etch stop layer 608 and the first semiconductor substrate 606. The acts at FIGS. 16-18 are employed to pattern the epitaxial stack 610 (see FIG. 38) so as to define mesa structures 108 at the mesa areas 702 (see FIG. 38). The patterning comprises forming hard masks 502 on the epitaxial stack 610, and subsequently performing an etch into the epitaxial stack 610 with the hard masks 502 in place. During the etch, the second etch stop layer 402 is used as an etch stop. The etch may, for example, be performed by a wet or chemical etching process and/or may, for example, be performed by some other suitable etching process.

In some embodiments, material from the epitaxial stack 610 and material from the mesa-side bumps 112 combines in such a way that the diffusion layers 118 are difficult to etch and/or remove by a wet etchant. Where the etch may be performed without etching through the diffusion layers 118, the etch may be performed by wet etching. Otherwise, the etch may, for example, be performed using ion bombardment. However, ion bombardment introduces a number of challenges described above. Since the second etch stop layer 402 causes the diffusion layers 118 to form localized to the mesa areas 702 (see FIG. 39) and hence the mesa structures 108, the etch may be performed without etching through the diffusion layers 118 and the challenges associated with ion bombardment may be avoided.

Also illustrated by the cross-sectional view 3900 of FIG. 39, the second etch stop layer 402 is patterned according to a layout of the hard masks 502. The patterning may, for example, be performed by an etching process and/or some other suitable patterning process. The etching process may, for example, comprise applying a wet etchant, a dry etchant, some other suitable etchant(s), or any combination of the foregoing to the second etch stop layer 402.

Figure 40:
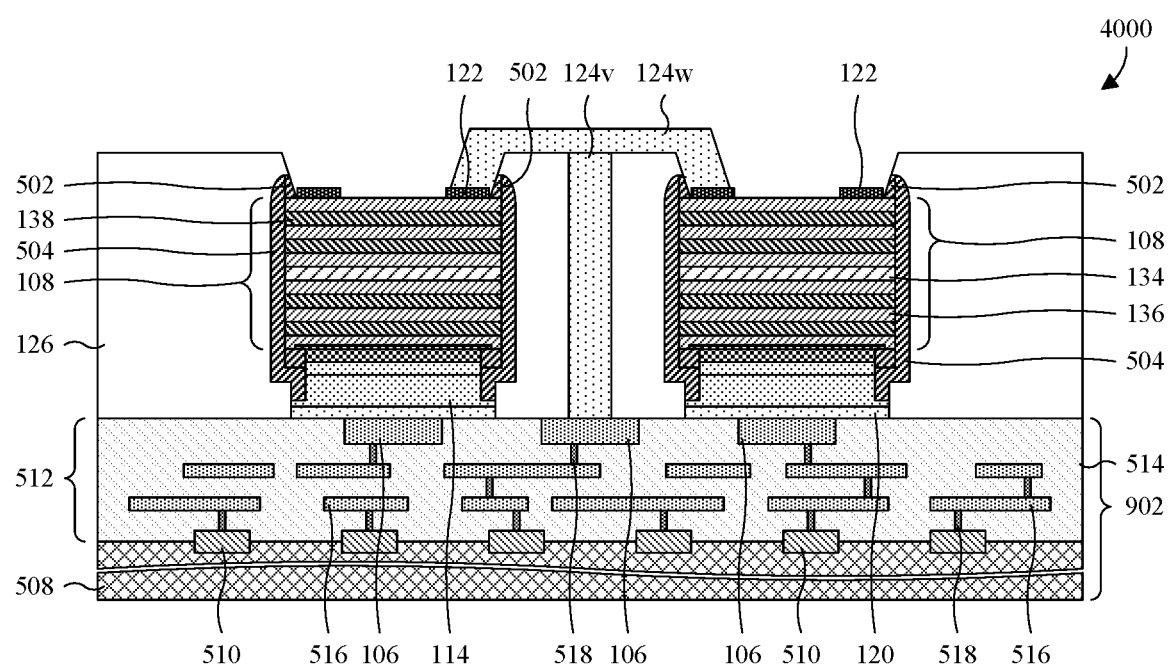

As illustrated by the cross-sectional view 4000 of FIG. 40, the acts at FIGS. 19-25 are performed as illustrated and described above. While performing the acts at FIG. 19, sidewall spacers 504 are formed on sidewalls of the mesa structures 108, sidewalls of the mesa-side bumps 112, and sidewalls of the substrate-side bumps 114. While performing the acts at FIG. 20, the seed layer 1004 is removed (see FIG. 39) and the first contact layer 1002 (see FIG. 39) is patterned to form backside contacts 120. Further, a dielectric structure 126 is formed surrounding the mesa structures 108. While performing the acts at FIG. 21, the dielectric structure 126 is patterned to form a via opening that is between neighboring mesa structures 108 and that exposes one of the pads 106. While performing the acts at FIG. 22, a via 124v is formed in the via opening. While performing the acts at FIG. 23, the dielectric structure 126 and the hard masks 502 are patterned to form contact openings exposing the mesa structures 108. While performing the acts at FIG. 24, frontside contacts 122 are formed in the contact openings, on the mesa structures 108. While performing the acts of FIG. 25, a wire 124w is formed electrically coupling the via 124v to the frontside contacts 122.

Figure 41:
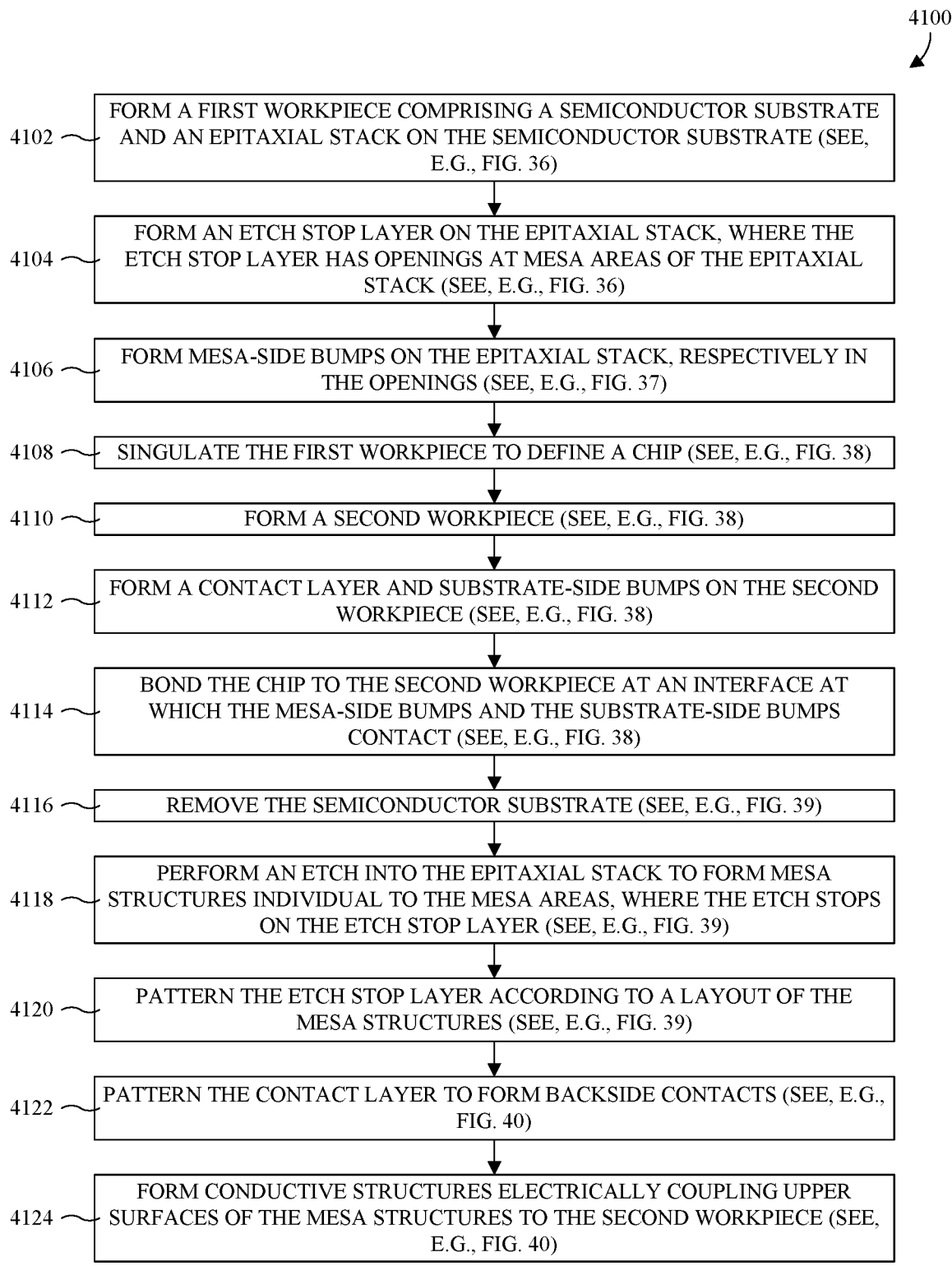
FIG. 41 illustrates a block diagram of some embodiments of the method of FIGS. 36-40.

With reference to FIG. 41, a block diagram 4100 of some embodiments of the method of FIGS. 36-40 is provided.

At 4102, a first workpiece comprising a semiconductor substrate and an epitaxial stack on the semiconductor substrate is formed. See, for example, FIG. 36.

At 4104, an etch stop layer is formed on the epitaxial stack, where the etch stop layer has openings at mesa areas of the epitaxial stack. See, for example, FIG. 36.

At 4106, mesa-side bumps are formed on the epitaxial stack, respectively in the openings. See, for example, FIG. 37.

At 4108, the first workpiece is singulated to define a chip. See, for example, FIG. 38.

At 4110, a second workpiece is formed. See, for example, FIG. 38.

At 4112, a contact layer and substrate-side bumps are formed on the second workpiece. See, for example, FIG. 38.

At 4114, the chip is bonded to the second workpiece at an interface at which the mesa-side bumps and the substrate-side bumps contact. See, for example, FIG. 38.

At 4116, the semiconductor substrate is removed. See, for example, FIG. 39.

At 4118, an etch is performed into the epitaxial stack to form mesa structures individual to the mesa areas, where the etch stops on the etch stop layer. See, for example, FIG. 39.

At 4120, the etch stop layer is patterned according to a layout of the mesa structures. See, for example, FIG. 39.

At 4122, the contact layer is patterned to form backside contacts. See, for example, FIG. 40.

At 4124, conductive structures are formed electrically coupling upper surfaces of the mesa structures to the second workpiece. See, for example, FIG. 40.

While the block diagram 4100 of FIG. 41 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated chip including: a substrate; a mesa structure on the substrate and including semiconductor material; a bump structure between the substrate and the mesa structure, wherein the bump structure includes conductive material; and a diffusion layer recessed into the mesa structure, between the bump structure and the mesa structure; wherein the diffusion layer includes semiconductor and conductive material respectively from the mesa structure and the bump structure, and sidewalls of the diffusion layer are spaced from sidewalls of the mesa structure.

In some embodiments, the present application provides a method for forming an integrated chip, the method including: forming a chip including an epitaxial stack and a first metal bump on the epitaxial stack, wherein the first metal bump is localized to a mesa area of the epitaxial stack; forming a second metal bump on a substrate; bonding the chip to the substrate at an interface at which the first and second metal bumps contact each other; and performing an etch into the chip to define a mesa structure at the mesa area of the epitaxial stack, wherein sidewalls of the mesa structure are laterally offset from sidewalls of the first metal bump.

In some embodiments, the present application provides another method for forming an integrated chip, the method including: forming a chip including an epitaxial stack, an etch stop layer, and a metal layer, wherein the etch stop layer is between the epitaxial stack and the metal layer; forming a first metal bump on a substrate; bonding the chip to the substrate, such that the metal layer is between the first metal bump and the epitaxial stack; performing an etch into the epitaxial stack to define a mesa structure, wherein the etch stops on the etch stop layer; patterning the etch stop layer to transfer a pattern of the mesa structure to the etch stop layer; and patterning the metal layer to form a second metal bump between the first metal bump and the mesa structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a substrate;
   a mesa structure overlying the substrate and comprising a semiconductor material;
   a bump structure between the substrate and the mesa structure, wherein the bump structure comprises a conductive material at a top of the bump structure; and
   a diffusion layer between and bordering the bump structure and the mesa structure, wherein the diffusion layer is recessed into the mesa structure and comprises the semiconductor and conductive materials, wherein a sidewall of the diffusion layer is laterally offset from a neighboring semiconductor sidewall of the mesa structure that comprises the semiconductor material, and wherein the sidewall has an edge elevated relative to a bottom edge of the neighboring semiconductor sidewall and recessed relative to a top edge of the neighboring semiconductor sidewall.

2. The integrated chip according to claim 1, further comprising:
   an etch stop layer on the mesa structure, between the mesa structure and the substrate, wherein the bump structure extends through the etch stop layer to the diffusion layer.

3. The integrated chip according to claim 2, wherein the bump structure wraps around an adjoining corner of the etch stop layer.

4. The integrated chip according to claim 1, wherein the mesa structure comprises a semiconductor layer within which the diffusion layer is recessed.

5. The integrated chip according to claim 1, wherein the mesa structure comprises a first alternating stack of different group III-V layers, an active group III-V layer overlying the first alternating stack, and a second alternating stack of different group III-V layers overlying the active group III-V layer.

6. The integrated chip according to claim 1, further comprising:
   a conductive contact on the mesa structure, wherein the mesa structure is between the conductive contact and the bump structure; and a conductive structure extending from the substrate to the conductive contact, wherein the conductive structure has a T-shaped profile.

7. The integrated chip according to claim 1, wherein the substrate comprises:
   a semiconductor substrate;
   semiconductor devices on the semiconductor substrate; and
   an interconnect structure covering the semiconductor substrate and the semiconductor devices.

8. The integrated chip according to claim 1, wherein a bottom edge of the sidewall is level with the bottom edge of the neighboring semiconductor sidewall.

9. An integrated chip comprising:
   a substrate;
   a mesa structure overlying the substrate and comprising a semiconductor layer;
   a conductive bump structure between the substrate and the mesa structure; and
   a diffusion layer between the conductive bump structure and the mesa structure, wherein the diffusion layer is sunken into a bottom of the semiconductor layer and has a width less than that of the semiconductor layer at the bottom, and wherein the diffusion layer comprises a semiconductor material of the semiconductor layer and further comprises a conductive material that diffused from the conductive bump structure to the diffusion layer.

10. The integrated chip according to claim 9, wherein the diffusion layer directly contacts the conductive bump structure at an interface, and wherein the conductive bump structure has the conductive material at the interface.

11. The integrated chip according to claim 9, wherein the diffusion layer directly contacts the semiconductor layer at an interface, and wherein the interface has an inverted U-shaped profile.

12. The integrated chip according to claim 9, wherein the mesa structure comprises a pair of Bragg reflectors and an active semiconductor layer that are vertically stacked with the active semiconductor layer between the Bragg reflectors.

13. The integrated chip according to claim 9, further comprising:
   an etch stop layer on the bottom of the mesa structure, wherein the conductive bump structure protrudes through the etch stop layer.

14. An integrated chip comprising:
   a substrate;
   a vertical-cavity surface-emitting laser (VCSEL) overlying the substrate, wherein the VCSEL comprises a semiconductor layer at a bottom surface of the VCSEL;
   a bump structure between the substrate and the VCSEL, wherein the bump structure comprises a conductive material at a top surface of the bump structure; and
   a diffusion layer between the bump structure and the VCSEL, wherein the diffusion layer directly contacts the top surface of the bump structure and comprises the conductive material and a semiconductor material of the semiconductor layer;
   wherein the semiconductor layer wraps around a corner of the diffusion layer from a sidewall of the diffusion layer to a top surface of the diffusion layer.

15. The integrated chip according to claim 14, wherein the diffusion layer is a region of the semiconductor layer to which the conductive material diffused and at which the conductive and semiconductor materials mixed.

16. The integrated chip according to claim 14, wherein the top surface of the bump structure has a width-wise center aligned to a width-wise center of the diffusion layer.

17. The integrated chip according to claim 14, wherein the conductive material comprises a semiconductor.

18. The integrated chip according to claim 14, wherein the diffusion layer directly contacts the bottom surface of the VCSEL.

19. The integrated chip according to claim 14, wherein the diffusion layer comprises germanium, gallium, arsenic, or any combination of the foregoing from the VCSEL, and wherein the diffusion layer further comprises nickel, gold, or any combination of the foregoing from the bump structure.

20. The integrated chip according to claim 14, wherein the bump structure has an inverted T-shaped profile.

* * * * *